(12) United States Patent
Shibata et al.

(10) Patent No.: US 7,088,501 B2
(45) Date of Patent: Aug. 8, 2006

(54) OPTICAL AMPLIFIER

(75) Inventors: Yasuo Shibata, Tokyo (JP); Nobuhiro Kikuchi, Kanagawa (JP); Hiromi Oohashi, Kanagawa (JP); Yuichi Thomori, Kanagawa (JP)

(73) Assignee: Nippon Telegraph & Telephone Corporation, Tokyo (JP)

( * ) Notice: Subject to any disclaimer, the term of this patent is extended or adjusted under 35 U.S.C. 154(b) by 183 days.

(21) Appl. No.: 10/265,065

(22) Filed: Oct. 3, 2002

(65) Prior Publication Data

US 2003/0067678 A1 Apr. 10, 2003

(51) Int. Cl.
*H01S 3/00* (2006.01)

(52) U.S. Cl. ...................................... 359/344

(58) Field of Classification Search ............. 359/341.4, 359/341.42, 344
See application file for complete search history.

(56) References Cited

U.S. PATENT DOCUMENTS

| | | | | |
|---|---|---|---|---|
| 4,886,344 A * | 12/1989 | Scheuble et al. | ............ | 349/179 |
| 5,748,811 A * | 5/1998 | Amersfoort et al. | .......... | 385/15 |
| 5,933,554 A * | 8/1999 | Leuthold et al. | ............... | 385/28 |
| 5,999,284 A * | 12/1999 | Roberts | ........................ | 359/108 |
| 5,999,293 A * | 12/1999 | Manning | ...................... | 398/52 |
| 6,069,732 A * | 5/2000 | Koch et al. | .................. | 359/344 |
| 6,366,382 B1 * | 4/2002 | Morthier et al. | ............. | 398/178 |
| 6,522,462 B1 * | 2/2003 | Chu et al. | .................... | 359/344 |
| 6,753,996 B1 * | 6/2004 | Shibata et al. | ............... | 359/279 |
| 6,766,072 B1 * | 7/2004 | Marazzi et al. | ................ | 385/14 |
| 2005/0013568 A1 * | 1/2005 | Handelman | .................. | 385/122 |

FOREIGN PATENT DOCUMENTS

| | | |
|---|---|---|
| JP | 2000-012978 | 1/2000 |
| JP | 2000012978 | 1/2000 |
| JP | 2000151028 | 5/2000 |
| WO | WO 96/13084 | 5/1996 |

OTHER PUBLICATIONS

Weik, Martin. Fiber Optics Standard Dictionary. 3rd Edition. Champman & Hall. 1997. pp. 673 and 470.*
Besse, et al., "Monolithically Integrated Gain-Clamped Semiconductor Optical Amplifier Exploiting Mach-Zehnder Interferometer Configuration", 22nd European Conference on Optical Communication—ECOC '96, Olso, vol. 3, Sep. 15, 1996.

* cited by examiner

*Primary Examiner*—Deandra M. Hughes
(74) *Attorney, Agent, or Firm*—Ben J. Yorks; Irell & Manella LLP

(57) ABSTRACT

An optical amplifier includes a first optical path, second optical path, semiconductor optical amplifier, and multi-mode interference 3-dB coupler. The first optical path guides oscillation light. The second optical path guides signal light. The semiconductor optical amplifier causes oscillation on the first optical path. The multi-mode interference 3-dB coupler crosses the first and optical paths in the gain medium of the semiconductor optical amplifier.

24 Claims, 16 Drawing Sheets

OPTICAL AMPLIFIER

BACKGROUND OF THE INVENTION

The present invention relates to an optical amplifier and, more particularly, to an optical amplifier which can suitably be applied to an optical transmission system for optical communication, optical switching, optical information processing, or the like.

As an optical transmission system for transmitting a plurality of optical signals having different wavelengths, conventionally, an optical transmission system (WDM (Wavelength Division Multiplexing) system) using WDM in which a plurality of optical signals having different wavelengths are coupled to one optical fiber and transmitted is known. In this WDM system, not only one-to-one transmission but also networking is rapidly making progress.

In the WDM system, optical elements such as a WDM multiplexing/demultiplexing circuit for multiplexing/demultiplexing optical signals in accordance with their wavelengths, a multiplexing/demultiplexing circuit for multiplexing/demultiplexing light components of all wavelengths at once, and an ADM (Add-Drop Multiplexer) for extracting or inserting a specific wavelength are used. When an optical signal passes through these optical elements, an intensity loss is generated, resulting in a decrease in signal intensity.

To prevent this, an optical amplifier for directly amplifying an optical signal transmitted through an optical fiber is indispensable in the WDM system.

FIGS. 4A and 4B show the first structural example of a conventional semiconductor optical amplifier. FIG. 4A shows a section taken along a line B—B in FIG. 4B along the signal light propagation direction. FIG. 4B shows a section taken along a line A—A in FIG. 4A perpendicular to the signal light propagation direction. FIGS. 4A and 4B show an example of a conventional SOA (Semiconductor Optical Amplifier) which uses an n-InP substrate 101.

Referring to FIGS. 4A and 4B, an InGaAsP active layer 102 serving as a gain medium is formed into a stripe on the n-InP substrate 101. The InGaAsP active layer 102 is buried by a p-InP layer 103 and n-InP layer 104.

A p-InP layer 105 is formed on the InGaAsP active layer 102 and n-InP layer 104. A p-InGaAsP cap layer 106 is formed on the p-InP layer 105.

A p-side electrode 107 is formed on the p-InGaAsP cap layer 106. An n-side electrode 108 is formed on the lower surface of the n-InP substrate 101.

FIG. 5 shows the saturation characteristic of the semiconductor optical amplifier shown in FIGS. 4A and 4B. Referring to FIG. 5, when the input light intensity is low, an almost constant gain is obtained even when the input light intensity increases. However, when the input light intensity exceeds a specific value, the gain abruptly decreases.

In the WDM system, a wavelength-multiplexed signal is incident as an optical signal. The number of multiplexed wavelengths incident varies every time the signal passes through an add-drop multiplexer and the like.

Assume that an optical signal whose number of multiplexed wavelengths is m becomes incident on the semiconductor optical amplifier. In this case, when the incident light intensity of the semiconductor optical amplifier is $P_1$ (dBm) for the total of m wavelengths, the gain of the semiconductor optical amplifier is $G_1$ (dBm).

Assume that an optical signal is added by an add-drop multiplexer, and the number of multiplexed wavelengths increases to n. In this case, when the incident light intensity of the semiconductor optical amplifier is $P_2$ (dBm) for the total of n wavelengths, the gain of the semiconductor optical amplifier is $G_2$ (dBm).

As described above, when the semiconductor optical amplifier shown in FIGS. 4A and 4B is used in the WDM system, the gain of the optical signal varies depending on the number of multiplexed wavelengths.

Some conventional optical amplifiers use a method of clamping the gain to a predetermined value using oscillation to prevent the variation in gain of the optical signal depending on the number of multiplexed wavelengths.

FIGS. 6A and 6B show the second structural example of a conventional semiconductor optical amplifier. Referring to FIGS. 6A and 6B, an InGaAsP active layer 202 serving as a gain medium is formed into a stripe on an n-InP substrate 201. The InGaAsP active layer 202 is buried by a p-InP layer 203 and n-InP layer 204.

An InGaAsP separate confinement heterostructure (SCH) layer 209 is formed on the lower surface of the InGaAsP active layer 202. An InGaAsP separate confinement heterostructure (SCH) layer 210 is formed on the upper surface of the InGaAsP active layer 202. The InGaAsP separate confinement heterostructure layer 210 has a grating.

A p-InP layer 205 is formed on the InGaAsP separate confinement heterostructure layer 210 and n-InP layer 204. A p-InGaAsP cap layer 206 is formed on the p-InP layer 205.

A p-side electrode 207 is formed on the p-InGaAsP cap layer 206. An n-side electrode 208 is formed on the lower surface of the n-InP substrate 201.

In the semiconductor optical amplifier shown in FIGS. 6A and 6B, since an optical signal is reflected by the grating formed on the InGaAsP separate confinement heterostructure layer 210, forward feedback occurs. Hence, the semiconductor optical amplifier can be oscillated, like a DFB laser. However, the coupling coefficient of the grating is smaller than that of a normal DFB laser, and the oscillation threshold value is large.

In the laser oscillation state of the semiconductor optical amplifier shown in FIGS. 6A and 6B, the carrier density in the gain medium is clamped to a predetermined value. However, since the oscillation threshold value is large, the carrier density is clamped to a value larger than that of a normal DFB laser.

For this reason, in the DFB semiconductor optical amplifier having a grating in FIGS. 6A and 6B, the carrier density in the gain medium (active layer 202) is constant as far as oscillation is taking place. Since the gain is proportional to the carrier density in the gain medium, the gain can be clamped to a predetermined value.

Hence, in the above oscillation state, even when the value of the current supplied to the semiconductor optical amplifier is increased, the gain of the semiconductor optical amplifiers is kept constant, although the light intensity of the oscillation light increases. In addition, when the input signal light intensity increases, the oscillation light intensity decreases so that the total light intensity in the semiconductor optical amplifiers is kept constant. For this reason, the gain of the semiconductor optical amplifier can be kept constant without generating any variation in carrier density in the semiconductor optical amplifier.

FIG. 7 shows the saturation characteristic of the semiconductor optical amplifier shown in FIGS. 6A and 6B. Referring to FIG. 7, in the semiconductor optical amplifier shown in FIGS. 6A and 6B, even when the input light intensity of externally incident signal light varies, the gain is kept at a predetermined value Go. As shown in FIG. 7, even when the number of multiplexed wavelengths of the signal light changes from m to n, and the total input power changes from $P_1$ to $P_2$, the gain keeps the predetermined value Go.

In the semiconductor optical amplifier shown in FIGS. 6A and 6B, the gain decreases only when the external incident light intensity further increases, and oscillation is suppressed. Conversely, as long as oscillation is occurring in the semiconductor optical amplifier shown in FIGS. 6A and 6B, the gain can be kept constant independently of the incident light intensity or the number of multiplexed wavelengths of the incident signal.

However, when the DFB semiconductor optical amplifier shown in FIGS. 6A and 6B is used, oscillation light mixes into the same optical path as that of the signal light. Hence, a wavelength filter for removing the mixed oscillation light is necessary. In addition, in the DFB semiconductor optical amplifier shown in FIGS. 6A and 6B, the oscillation light intensity is very high. If the incident signal intensity is low, the oscillation light having almost the same intensity as that of the signal light remains even when a normal wavelength filter is used.

To solve these problems, an optical amplification apparatus has been proposed (Japanese Patent Laid-Open No. 2000-12978), in which a gain region is inserted to two arm waveguides of a symmetrical Mach-Zehnder interference circuit, a light reflection means is arranged at an input port serving as the cross port of the symmetrical Mach-Zehnder interference circuit, and a laser resonator is formed by the light reflection means and the gain region. In this optical amplification apparatus, signal light input from the port to which the light reflection means is not connected is amplified in the gain region in which the signal gain is clamped to the laser oscillation threshold state, and the amplified signal light is separated from the laser oscillation light and output from a different port.

However, in the above-described conventional semiconductor optical amplifier or optical amplification apparatus, since the gain of the signal light is clamped to a laser oscillation threshold state, the gain of the signal light cannot be adjusted.

SUMMARY OF THE INVENTION

The present invention has been made to solve the above problems, and has as its object to provide an optical amplifier which can suppress any gain variation depending on the input light intensity without mixing oscillation light with signal light.

In order to achieve the above object, according to the present invention, there is provided an optical amplifier comprising a first optical path which guides oscillation light, a second optical path which guides signal light, oscillation means for causing oscillation on the first optical path, and crossing means for crossing the first optical path and the second optical path in a gain medium of the oscillation means.

DESCRIPTION OF THE PREFERRED EMBODIMENTS

The embodiments of the present invention will be described below with reference to the accompanying drawings.

First Embodiment

Figure 1:
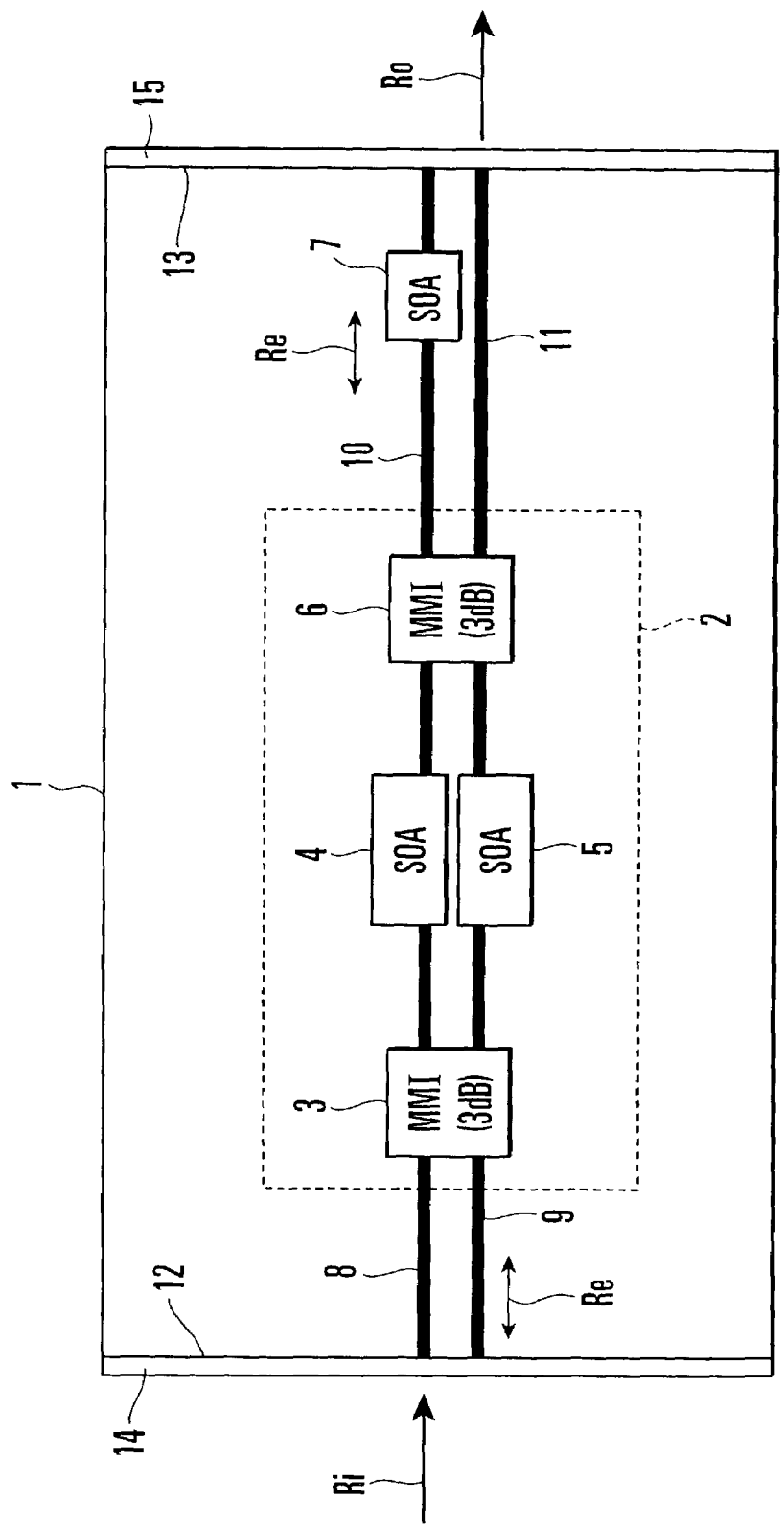
FIG. 1 is a plan view showing the arrangement of an optical amplifier according to the first embodiment of the present invention.

FIG. 1 shows the arrangement of an optical amplifier according to an embodiment of the present invention. Referring to FIG. 1, multi-mode interference 3-dB couplers (MMI couplers) 3 and 6 serving as a crossing means, semiconductor optical amplifiers (SOAs) 4, 5, and 7, an input waveguide 8, oscillation light waveguides 9 and 10, and an output waveguide 11 are arranged on a substrate 1. Anti-reflection films 14 and 15 are formed on end faces 12 and 13 of the substrate 1, respectively.

The anti-reflection films 14 and 15 are made of, e.g., a multilayered film of $TiO_2$ and $SiO_2$. The residual reflectance of the anti-reflection films 14 and 15 can be set to, e.g., about 0.1%.

The multi-mode interference 3-dB couples 3 and 6 and semiconductor optical amplifiers 4 and 5 form a symmetrical Mach-Zehnder interference circuit 2. The input waveguide 8 and oscillation light waveguide 9 are arranged between the multi-mode interference 3-dB coupler 3 and the end face 12. The oscillation light waveguide 10 and output waveguide 11 are arranged between the multi-mode interference 3-dB coupler 6 and the end face 13. The semiconductor optical amplifier 7 is inserted into the oscillation light waveguide 10.

The operation of the optical amplifier shown in FIG. 1 will be described below by exemplifying a case wherein the gain of the semiconductor optical amplifiers 4 and 5 is 20 dB, and the gain of the semiconductor optical amplifier 7 is 10 dB.

Almost the same current is injected to the semiconductor optical amplifiers 4 and 5 of the symmetrical Mach-Zehnder interference circuit 2 such that the gain of the semiconductor optical amplifiers 4 and 5 becomes 20 dB. A current is injected to the semiconductor optical amplifier 7 connected to the oscillation light waveguide 10 such that the gain of the semiconductor optical amplifier 7 becomes 10 dB.

Since almost the same current is injected to the semiconductor optical amplifiers 4 and 5, the symmetry of the symmetrical Mach-Zehnder interference circuit 2 is preserved. Light that becomes incident on the symmetrical Mach-Zehnder interference circuit 2 through the input waveguide 8 is guided to the output waveguide 11. Light that becomes incident on the symmetrical Mach-Zehnder interference circuit 2 through the oscillation light waveguide 9 is guided to the oscillation light waveguide 10. The light that becomes incident on the symmetrical Mach-Zehnder interference circuit 2 through the oscillation light waveguide 9 is branched into two components by the multi-mode interference 3-dB coupler 3. The two branched light components are amplified by 20 dB by the semiconductor optical amplifiers 4 and 5. The light thus amplified by 20 dB is coupled to the oscillation light waveguide 10 through the multi-mode interference 3-dB coupler 6 without any principle loss. The light that has coupled to the oscillation light waveguide 10 is amplified by 10 dB by the semiconductor optical amplifier 7 and reaches the end face 13 of the substrate 1.

Since the residual reflectance of the anti-reflection film 15 is about 0.1%, the light that has reached the end face 13 in the above way is reflected at a reflectance of 0.1% and passes through the oscillation light waveguide 10 back to be incident on the semiconductor optical amplifier 7 again.

The light incident again on the semiconductor optical amplifier 7 is amplified by 10 dB and branched into two light components by the multi-mode interference 3-dB coupler 6. The two branched light components are amplified by 20 dB by the semiconductor optical amplifiers 4 and 5. The light thus amplified by 20 dB is coupled to the oscillation light waveguide 9 through the multi-mode interference 3-dB coupler 3 without any principle loss. The light that has coupled to the oscillation light waveguide 9 reaches the end face 12 of the substrate 1 and is reflected by the anti-reflection film 14 at a reflectance of 0.1%. The light reflected by the anti-reflection film 14 passes through the oscillation light waveguide 9 back to be incident on the symmetrical Mach-Zehnder interference circuit 2 again.

The light intensity when the light becomes incident from the oscillation light waveguide 9 on the symmetrical Mach-Zehnder interference circuit 2 for the first time will be compared with the light intensity when the light reciprocates through the substrate 1 once while being reflected by the two end faces 12 and 13 of the substrate 1 and then becomes incident from the oscillation light waveguide 9 on the symmetrical Mach-Zehnder interference circuit 2 again.

Since 20-dB amplification and 10-dB amplification are executed twice, the gain is 60 dB (i.e., $10^6$). Since this light is reflected twice at a reflectance of 0.1% (i.e., $10^{-3}$), the loss is $10^{-6}$. As a result, the light intensity after the light has reciprocated once is just $10^6 \times 10^{-6} = 1$.

For this reason, even without any external optical input, the light can continuously be propagated through the substrate 1. Since a cavity is generated in the optical path from the end face 12 to the end face 13 of the substrate 1 through the oscillation light waveguide 9, symmetrical Mach-Zehnder interference circuit 2, oscillation light waveguide 10, and semiconductor optical amplifier 7, oscillation can be caused in the substrate 1.

The carrier density in the gain medium in the oscillated state is clamped to the threshold carrier density. Hence, even when the amount of the current injected to the semiconductor optical amplifiers 4 and 5 is increased, the carrier density in the gain medium does not change. For this reason, even when the amount of the current injected to the semiconductor optical amplifiers 4 and 5 is increased, the gain does not change, either, and only the light intensity of oscillation light Re increases.

In this oscillated state, when input signal light Ri is incident on the input waveguide 8 through the anti-reflection film 14, the light becomes incident on the multi-mode interference 3-dB coupler 3 through the input waveguide 8 and is branched into two light components. The two branched light components are amplified by 20 dB by the semiconductor optical amplifiers 4 and 5. The light thus amplified by 20 dB is coupled to the output waveguide 11 through the multi-mode interference 3-dB coupler 6 without any principle loss. The light that has coupled to the output waveguide 11 reaches the end face 13 of the substrate 1. Of this light, 0.1% is reflected by the anti-reflection film 15, and the remaining 99.9% emerges from the substrate 1 as output signal light Ro through the anti-reflection film 15.

In the path from the input waveguide 8 to the output waveguide 11 through the symmetrical Mach-Zehnder interference circuit 2, the total gain is 20 dB on one way. For this reason, even when the 0.1% residual reflection by the end faces 12 and 13 exists, no oscillation occurs. Hence, traveling wave optical amplification operation can be performed.

Figure 7:
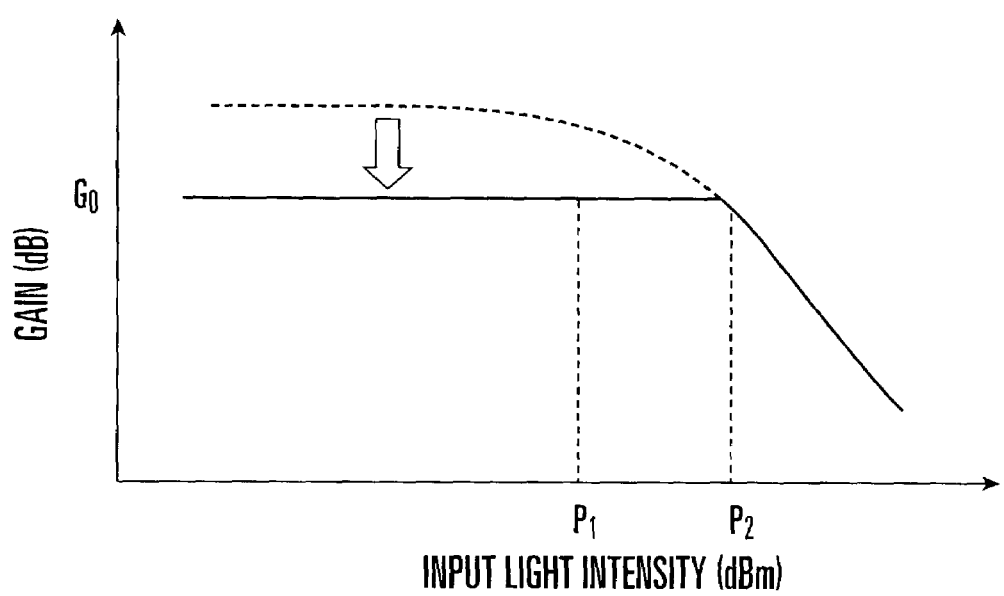
FIG. 7 is a graph showing the saturation characteristic of the semiconductor optical amplifier shown in FIGS. 6A and 6B.

When the intensity of the input signal light Ri increases, the intensity of the oscillation light Re decreases to keep the total light intensity constant in the semiconductor optical amplifiers 4 and 5. For this reason, the carrier density in the semiconductor optical amplifiers 4 and 5 does not vary, the gain is also kept constant, and the saturation characteristic shown in FIG. 7 is obtained. Even when the number of multiplexed wavelengths of the input signal light Ri changes, the gain does not change, and stable operation can be performed.

The gain adjustment method of the optical amplifier shown in FIG. 1 will be described next.

When the gain on one way in the cavity formed by the optical path from the end face 12 to the end face 13 of the substrate 1 through the oscillation light waveguide 9, symmetrical Mach-Zehnder interference circuit 2, oscillation light waveguide 10, and semiconductor optical amplifier 7 becomes the reciprocal of the end face residual reflectance, oscillation starts, and the gain is clamped. In this case, the residual reflectance of the anti-reflection films 14 and 15 is 0.1%. Hence, when the sum of the gain of the semiconductor optical amplifier 4 or 5 and the gain of the semiconductor optical amplifier 7 is 30 dB, the gain is clamped.

For example, when the gain of the semiconductor optical amplifier 7 is set to 10 dB, the gain of the semiconductor optical amplifiers 4 and 5 is clamped to 20 dB.

For this reason, the clamped gain of the semiconductor optical amplifiers 4 and 5 that form the symmetrical Mach-Zehnder interference circuit 2 can be adjusted by adjusting the gain of the semiconductor optical amplifier 7.

For example, assume that the gain of the semiconductor optical amplifier 7 is 5 dB. Since the gain is clamped such that the sum of the gain of the semiconductor optical amplifier 4 or 5 and the gain of the semiconductor optical amplifier 7 becomes 30 dB, the gain of the semiconductor optical amplifiers 4 and 5 is clamped to the 25 dB.

The gain for the input signal light Ri is determined by the gain of the semiconductor optical amplifiers 4 and 5. For this reason, when the gain of the semiconductor optical amplifier 7 is adjusted to control the clamped gain of the semiconductor optical amplifiers 4 and 5, the gain of the input signal light Ri can be adjusted while suppressing any gain variation depending on the number of multiplexed wavelengths of the input signal light Ri.

On the other hand, the oscillation light Re is generated in the cavity formed by the optical path from the end face 12 to the end face 13 of the substrate 1 through the oscillation light waveguide 9, symmetrical Mach-Zehnder interference circuit 2, oscillation light waveguide 10, and semiconductor optical amplifier 7 because of the characteristic of the symmetrical Mach-Zehnder interference circuit 2. The oscillation light Re does not mix into the input waveguide 8 and output waveguide 11. The input signal light Ri and the output signal light Ro can be spatially separated from the oscillation light Re. For this reason, in the optical amplifier shown in FIG. 1, no external filter for removing the oscillation light Re from the input signal light Ri and output signal light Ro is necessary.

The structure of the semiconductor optical amplifiers used in the above-described embodiment is not particularly limited. When the structure is used for all semiconductor optical amplifiers normally used, the above-described effect can be obtained.

For example, an arbitrary material such as InGaAsP, GaAs, AlGaAs, InGaAs, or GaInNAs can be used for the active layer of the semiconductor optical amplifier.

In addition, a bulk structure, MQW (Multi Quantum Well), quantum wire, quantum dot, or the like can be used for the active layer structure of the semiconductor optical amplifier. The same effect as described above can be expected even by forming a separate confinement heterostructure layer on the upper or lower side or both sides of the active layer. For the waveguide structure of the semiconductor optical amplifier, even when a p-n burying structure, ridge structure, semi-insulating buried structure, high mesa structure, or the like is used, the same effect as described above can be expected. The substrate is also not limited to the n-type substrate. A p-type substrate, semi-insulating substrate, or the like may be used.

In the above embodiment, a multi-mode interference 3-dB coupler is used as a 3-dB coupler. However, a directional coupler may be used.

Second Embodiment

Figure 2:
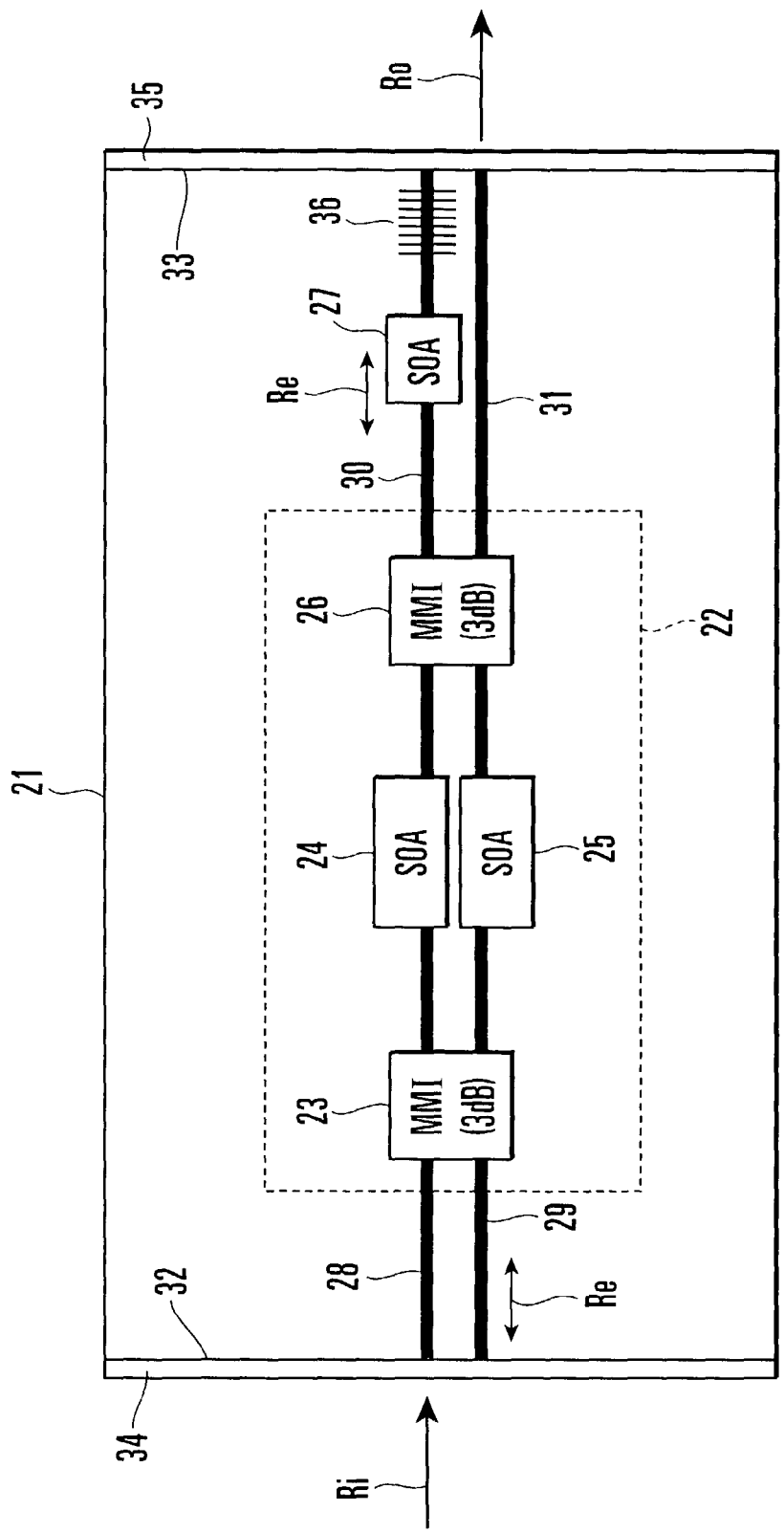
FIG. 2 is a plan view showing the arrangement of an optical amplifier according to the second embodiment of the present invention.

FIG. 2 shows the arrangement of an optical amplifier according to another embodiment of the present invention. In this second embodiment, a grating 36 is used to feed back oscillation light Re to semiconductor optical amplifiers 24 and 25.

Referring to FIG. 2, multi-mode interference 3-dB couplers 23 and 26, semiconductor optical amplifiers 24, 25, and 27, an input waveguide 28, oscillation light waveguides 29 and 30, and an output waveguide 31 are arranged on a substrate 21. Anti-reflection films 34 and 35 are formed on end faces 32 and 33 of the substrate 21, respectively. The anti-reflection films 34 and 35 can be made of, e.g., a multilayered film of $TiO_2$ and $SiO_2$. The residual reflectance of the anti-reflection films 34 and 35 can be set to, e.g., about 0.1%.

The multi-mode interference 3-dB couplers 23 and 26 and semiconductor optical amplifiers 24 and 25 form a symmetrical Mach-Zehnder interference circuit 22. The input waveguide 28 and oscillation light waveguide 29 are arranged between the multi-mode interference 3-dB coupler 23 and the end face 32. The oscillation light waveguide 30 and output waveguide 31 are arranged between the multi-mode interference 3-dB coupler 26 and the end face 33.

The semiconductor optical amplifier 27 and grating 36 are arranged on the oscillation light waveguide 30. Note that the wavelength of the oscillation light Re is determined by the grating 36, and the reflectance of the grating 36 can be set to, e.g., about 1%.

The operation of the optical amplifier shown in FIG. 2 will be described below by exemplifying a case wherein the gain of the semiconductor optical amplifiers 24 and 25 is 20 dB, and the gain of the semiconductor optical amplifier 27 is 5 dB.

Almost the same current is injected to the semiconductor optical amplifiers 24 and 25 of the symmetrical Mach-Zehnder interference circuit 22 such that the gain of the semiconductor optical amplifiers 24 and 25 becomes 20 dB. A current is injected to the semiconductor optical amplifier 27 connected to the oscillation light waveguide 30 such that the gain of the semiconductor optical amplifier 27 becomes 5 dB.

Since almost the same current is injected to the semiconductor optical amplifiers 24 and 25, the symmetry of the symmetrical Mach-Zehnder interference circuit 22 is preserved. Light that becomes incident on the symmetrical Mach-Zehnder interference circuit 22 through the input waveguide 28 is guided to the output waveguide 31. Light that becomes incident on the symmetrical Mach-Zehnder interference circuit 22 through the oscillation light waveguide 29 is guided to the oscillation light waveguide 30.

More specifically, the light that becomes incident on the symmetrical Mach-Zehnder interference circuit 22 through the oscillation light waveguide 29 is branched into two components by the multi-mode interference 3-dB coupler 23. The two branched light components are amplified by 20 dB by the semiconductor optical amplifiers 24 and 25. The light thus amplified by 20 dB is coupled to the oscillation light waveguide 30 through the multi-mode interference 3-dB coupler 26 without any principle loss. The light that has coupled to the oscillation light waveguide 30 is amplified by 5 dB by the semiconductor optical amplifier 27 and reaches the end face 33 of the substrate 21, through the grating 36.

The reflectance of the grating 36 is higher than the residual reflectance of the anti-reflection film 35 formed on the end face 33. The residual reflectance of the anti-reflection film 35 can substantially be neglected. Hence, the wavelength of the oscillation light Re is determined by the grating 36.

For this reason, when the reflectance of the grating 36 is about 1%, the light that has reached the grating 36 is reflected at the reflectance of 1% and passes through the oscillation light waveguide 30 back to be incident on the semiconductor optical amplifier 27 again.

The light incident again on the semiconductor optical amplifier 27 is amplified by 5 dB and branched into two light components by the multi-mode interference 3-dB coupler 26. The two branched light components are amplified by 20 dB by the semiconductor optical amplifiers 24 and 25. The light thus amplified by 20 dB is coupled to the oscillation light waveguide 29 through the multi-mode interference 3-dB coupler 23 without any principle loss. The light that has coupled to the oscillation light waveguide 29 reaches the end face 32 of the substrate 21 and is reflected by the anti-reflection film 34 at a reflectance of 0.1%. The light reflected by the anti-reflection film 34 passes through the oscillation light waveguide 29 back to be incident on the symmetrical Mach-Zehnder interference circuit 22 again.

The light intensity when the light becomes incident from the oscillation light waveguide 29 on the symmetrical Mach-Zehnder interference circuit 22 for the first time will be compared with the light intensity when the light reciprocates through the substrate 21 once while being reflected by the end face 32 of the substrate 21 and the grating 36 and then becomes incident from the oscillation light waveguide 29 on the symmetrical Mach-Zehnder interference circuit 22 again. Since 20-dB amplification and 5-dB amplification are executed twice, the gain is 50 dB (i.e., $10^5$). Since this light is reflected once each at a reflectance of 0.1% (i.e., $10^{-3}$) and at a reflectance of 1% (i.e., $10^{-2}$), the loss is $10^{-5}$. As a result, the light intensity after the light has reciprocated once is just $10^5 \times 10^{-5} = 1$.

For this reason, even without any external optical input, the light can continuously be propagated through the substrate 21. Since a cavity is generated in the optical path from the end face 32 of the substrate 21 to the grating 36 through the oscillation light waveguide 29, symmetrical Mach-Zehnder interference circuit 22, oscillation light waveguide 30, and semiconductor optical amplifier 27, oscillation can be caused in the substrate 21.

In the above-described oscillated state, when input signal light Ri is incident on the input waveguide 28 through the anti-reflection film 34, the incident input signal light Ri becomes incident on the multi-mode interference 3-dB coupler 23 through the input waveguide 28 and is branched into two light components. The two light components branched by the multi-mode interference 3-dB coupler 23 are amplified by 20 dB by the semiconductor optical amplifiers 24 and 25. The light thus amplified by 20 dB is coupled to the output waveguide 31 through the multi-mode interference 3-dB coupler 26 without any principle loss. The light that has coupled to the output waveguide 31 reaches the end face 33 of the substrate 21. Of this light that has reached the end face 33, 0.1% is reflected by the anti-reflection film 35, and the remaining 99.9% emerges from the substrate 21 as output signal light Ro through the anti-reflection film 35.

In the path from the input waveguide 28 to the output waveguide 31 through the symmetrical Mach-Zehnder interference circuit 22, the total gain is 20 dB on one way. For this reason, even when the 0.1% residual reflection by the end faces 32 and 33 exists, no oscillation occurs. Hence, traveling wave optical amplification operation can be performed.

When the intensity of the input signal light Ri increases, the intensity of the oscillation light Re decreases to keep the total light intensity constant in the semiconductor optical amplifiers 24 and 25. For this reason, the carrier density in the semiconductor optical amplifiers 24 and 25 does not vary, the gain is, also kept constant, and the saturation characteristic is set in the state shown in FIG. 7.

For example, when the gain of the semiconductor optical amplifier 27 is set to 5 dB, the gain of the symmetrical Mach-Zehnder interference circuit 22 is clamped to 20 dB, so the gain of the input signal light Ri can be clamped to 20 dB.

Hence, even when the number of multiplexed wavelengths of the input signal light Ri changes, the gain does not change, and stable operation can be performed.

For the gain adjustment method of the optical amplifier shown in FIG. 2 as well, the clamped gain of the semiconductor optical amplifiers 24 and 25 that constitute the symmetrical Mach-Zehnder interference circuit 22 can be adjusted, and accordingly, the gain for the input signal light Ri can be adjusted by adjusting the gain of the semiconductor optical amplifier 27.

On the other hand, the oscillation light Re is generated in the cavity formed by the optical path from the end face 32 of the substrate 21 to the grating 36 through the oscillation light waveguide 29, symmetrical Mach-Zehnder interference circuit 22, oscillation light waveguide 30, and semiconductor optical amplifier 27 because of the characteristic of the symmetrical Mach-Zehnder interference circuit 22. The oscillation light Re does not mix into the input waveguide 28 and output waveguide 31. The input signal light Ri and the output signal light Ro can be spatially separated from the oscillation light Re. For this reason, in the optical amplifier shown in FIG. 2 as well, no external filter for removing the oscillation light Re from the input signal light Ri and output signal light Ro is necessary.

The structure of the semiconductor optical amplifiers used in the above-described embodiment is not particularly limited. When the structure is used for all semiconductor optical amplifiers normally used, the above-described effect can be obtained.

For example, an arbitrary material such(as InGaAsP, GaAs, AlGaAs, InGaAs, or GaInNAs can be used for the active layer of the semiconductor optical amplifier.

In addition, a bulk structure, MQW, quantum wire, quantum dot, or the like can be used for the active layer structure of the semiconductor optical amplifier. The same effect as described above can be expected even by forming a separate confinement heterostructure layer on the upper or lower side or both sides of the active layer. For the waveguide structure of the semiconductor optical amplifier, even when a p-n burying structure, ridge structure, semi-insulating buried structure, high mesa structure, or the like is used, the same effect as described above can be expected. The substrate is also not limited to the n-type substrate. A p-type substrate, semi-insulating substrate, or the like may be used.

In the above embodiment, a multi-mode interference 3-dB coupler is used as a 3-dB coupler. However, a directional coupler may be used.

Additionally, the grating 36 may be arranged on the oscillation light waveguide 29 on the input side. The semiconductor optical amplifier 27 may be arranged on the oscillation light waveguide 29.

Third Embodiment

Figure 3:
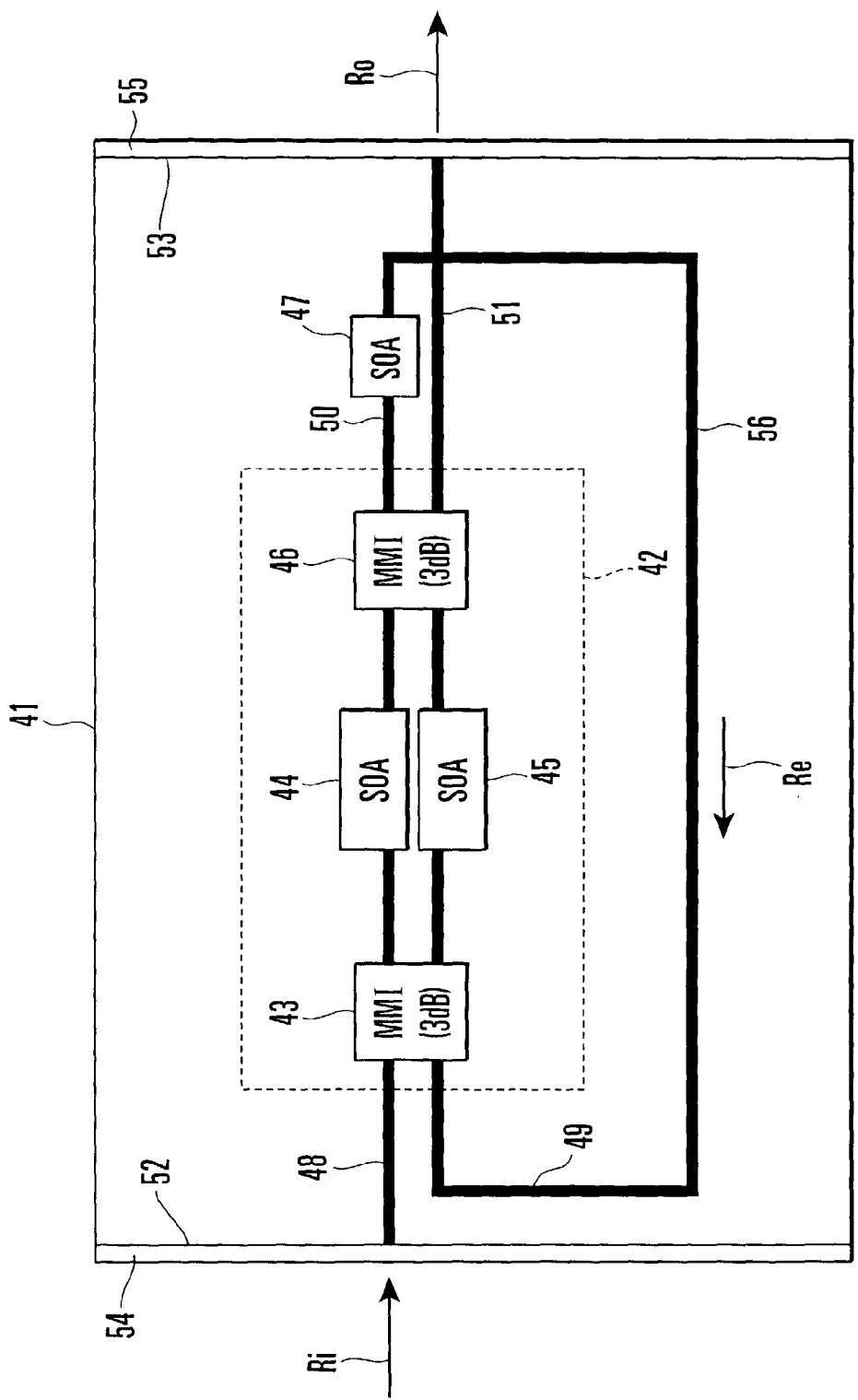
FIG. 3 is a plan view showing the arrangement of an optical amplifier according to the third embodiment of the present invention.
Figure 4A:
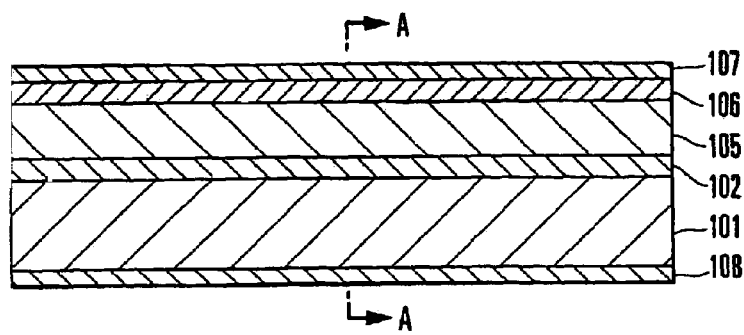
FIGS. 4A and 4B are sectional views showing the first structural example of a conventional semiconductor optical amplifier.
Figure 4B:
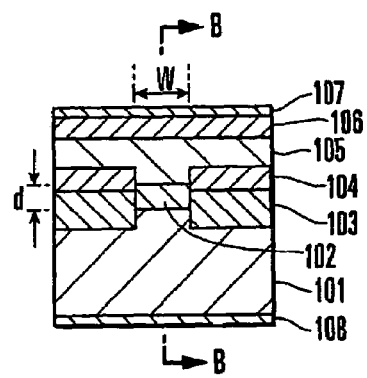
Figure 5:
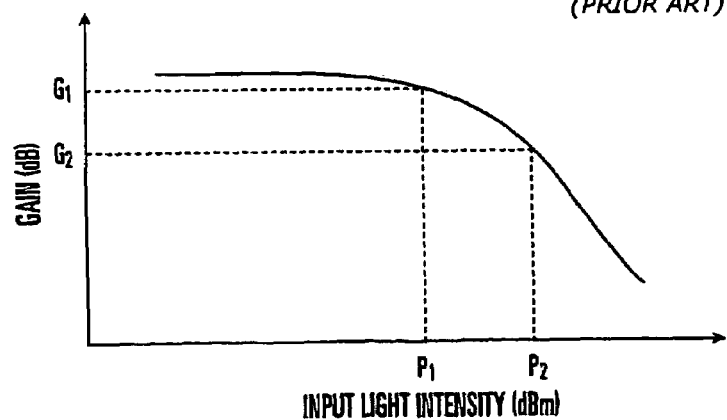
FIG. 5 is a graph showing the saturation characteristic of the semiconductor optical amplifier shown in FIGS. 4A and 4B.
Figure 6A:
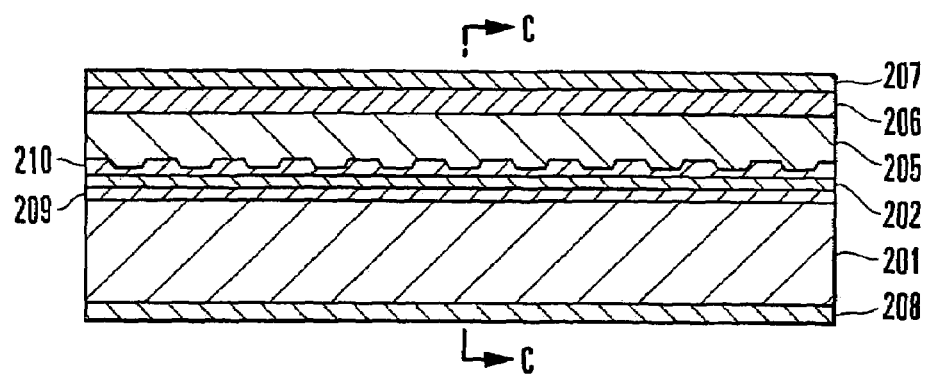
FIGS. 6A and 6B are sectional views showing the second structural example of a conventional semiconductor optical amplifier.
Figure 6B:
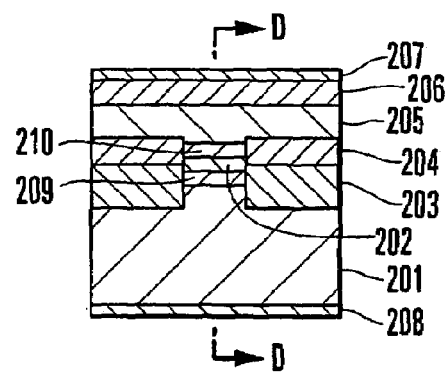

FIG. 3 shows the arrangement of an optical amplifier according to still another embodiment of the present invention. In the optical amplifier shown in FIG. 3, a loop waveguide 56 is used to feed back oscillation light Re to semiconductor optical amplifiers 44 and 45.

Referring to FIG. 3, multi-mode interference 3-dB couplers 43 and 46, semiconductor optical amplifiers 44, 45, and 47, an input waveguide 48, oscillation light waveguides 49 and 50, and an output waveguide 51 are arranged on a substrate 41. Anti-reflection films 54 and 55 are formed on end faces 52 and 53 of the substrate 41, respectively.

The anti-reflection films 54 and 55 can be made of, e.g., a multilayered film of $TiO_2$ and $SiO_2$. The residual reflectance of the anti-reflection films 54 and 55 can be set to, e.g., about 0.1%.

The multi-mode interference 3-dB couplers 43 and 46 and semiconductor optical amplifiers 44 and 45 form a symmetrical Mach-Zehnder interference circuit 42. The input waveguide 48 and oscillation light waveguide 49 are arranged between the multi-mode interference 3-dB coupler 43 and the end face 52. The oscillation light waveguide 50 and output waveguide 51 are arranged between the multi-mode interference 3-dB coupler 46 and the end face 53. The semiconductor optical amplifier 47 is arranged on the oscillation light waveguide 50.

The operation of the optical amplifier shown in FIG. 3 will be described below by exemplifying a case wherein the gain of the semiconductor optical amplifiers 44 and 45 is 20 dB, and the semiconductor optical amplifier 47 is used as a loss medium such that the loss in the loop circuit starting from the oscillation light waveguide 49 and reaching it again through the symmetrical Mach-Zehnder interference circuit 42, oscillation light waveguide 50, semiconductor optical amplifier 47, and loop waveguide 56 becomes 20 dB.

Almost the same current is injected to the semiconductor optical amplifiers 44 and 45 of the symmetrical Mach-Zehnder interference circuit 42 such that the gain of the semiconductor optical amplifiers 44 and 45 becomes 20 dB. A current is injected to the semiconductor optical amplifier 47 connected to the oscillation light waveguide 50 such that the loss in the loop circuit starting from the oscillation light waveguide 50 and reaching to the oscillation light waveguide 49 through the semiconductor optical amplifier 47, and loop waveguide 56 becomes 20 dB.

Since almost the same current is injected to the semiconductor optical amplifiers 44 and 45, the symmetry of the symmetrical Mach-Zehnder interference circuit 42 is preserved. Light that becomes incident on the symmetrical Mach-Zehnder interference circuit 42 through the input waveguide 48 is guided to the output waveguide 51. Light that becomes incident on the symmetrical Mach-Zehnder interference circuit 42 through the oscillation light waveguide 49 is guided to the oscillation light waveguide 50. The light that becomes incident on the symmetrical Mach-Zehnder interference circuit 42 through the oscillation light waveguide 49 is branched into two components by the multi-mode interference 3-dB coupler 43.

The two light components branched by the multi-mode interference 3-dB coupler 43 are amplified by 20 dB by the semiconductor optical amplifiers 44 and 45. The light thus amplified by 20 dB is coupled to the oscillation light waveguide 50 through the multi-mode interference 3-dB coupler 46 without any principle loss. The light that has coupled to the oscillation light waveguide 50 undergoes an absorption loss by the semiconductor optical amplifier 47 such that the loss in the loop circuit starting from the oscillation light waveguide 49 and reaching it again through the symmetrical Mach-Zehnder interference circuit 42, oscillation light waveguide 50, semiconductor optical amplifier 47, and loop waveguide 56 becomes 20 dB. The light that has undergone the absorption loss reaches the oscillation light waveguide 49 again through the loop waveguide 56 and becomes incident on the multi-mode interference 3-dB coupler 43.

The light intensity when the light becomes incident from the oscillation light waveguide 49 on the symmetrical Mach-Zehnder interference circuit 42 for the first time will be compared with the light intensity when the light passes through the oscillation light waveguide 49, symmetrical Mach-Zehnder interference circuit 42, oscillation light waveguide 50, semiconductor optical amplifier 47, and loop waveguide 56 and becomes incident again from the oscillation light waveguide 49 on the symmetrical Mach-Zehnder interference circuit 42. When the gain in the symmetrical Mach-Zehnder interference circuit 42 is 20 dB, the loss in the loop circuit starting from the oscillation light waveguide 50 and reaching to the oscillation waveguide 49 through the semiconductor optical amplifier 47, and loop waveguide 56 is set to be 20 dB. In this case, the product of the loss and gain in the loop circuit is 1.

For this reason, even without any external optical input, the light can continuously be propagated through the substrate 41. Since a cavity is generated in the optical path starting from the oscillation light waveguide 49 and reaching it again through the symmetrical Mach-Zehnder interference circuit 42, oscillation light waveguide 50, semiconductor optical amplifier 47, and loop waveguide 56, oscillation can be caused in the substrate 41.

In the above-described state, when input signal light Ri is incident on the input waveguide 48 through the anti-reflection film 54, the incident input signal light Ri becomes incident on the multi-mode interference 3-dB coupler 43 through the input waveguide 48 and is branched into two light components. The two light components branched by the multi-mode interference 3-dB coupler 43 are amplified by 20 dB by the semiconductor optical amplifiers 44 and 45. The light thus amplified by 20 dB is coupled to the output waveguide 51 through the multi-mode interference 3-dB coupler 46 without any principle loss.

The light that has coupled to the output waveguide 51 reaches the end face 53 of the substrate 41. Of this light that has reached the end face 53, 0.1% is reflected by the anti-reflection film 55, and the remaining 99.9% emerges from the substrate 41 as output signal light Ro through the anti-reflection film 55.

In the path from the input waveguide 48 to the output waveguide 51 through the symmetrical Mach-Zehnder interference circuit 42, the total gain is 20 dB on one way. For this reason, even when the 0.1% residual reflection by the end faces 52 and 53 exists, no oscillation occurs. Hence, traveling wave optical amplification operation can be performed.

When the intensity of the input signal light Ri increases, the intensity of the oscillation light Re decreases to keep the total light intensity constant in the semiconductor optical amplifiers 44 and 45. For this reason, the carrier density in the semiconductor optical amplifiers 44 and 45 does not vary, the gain is also kept constant, and the saturation characteristic shown in FIG. 7 is obtained. For example, even when the current injected to the semiconductor optical amplifiers 44 and 45 is increased in this state, the gain of the semiconductor optical amplifiers 44 and 45 is clamped to 20 dB, so the gain of the input signal light Ri can be clamped to 20 dB. Hence, even when the number of multiplexed wavelengths of the input signal light Ri changes, the gain does not change, and stable operation can be performed.

As described above, the loss in the loop circuit is very small. For this reason, when the semiconductor optical amplifier 47 is used not as a gain medium but as a loss medium, the optical amplifier can be operated with a large gain.

For the gain adjustment method of the optical amplifier shown in FIG. 3 as well, the clamped gain of the semiconductor optical amplifiers 44 and 45 that constitute the symmetrical Mach-Zehnder interference circuit 42 can be adjusted, and accordingly, the gain for the input signal light Ri can be adjusted by adjusting the gain or absorption loss of the semiconductor optical amplifier 47.

On the other hand, the oscillation light Re is generated in the cavity formed by the optical path starting from the oscillation light waveguide 49 and reaching it again through the symmetrical Mach-Zehnder interference circuit 42, oscillation light waveguide 50, semiconductor optical amplifier 47, and loop waveguide 56 because of the characteristic of the symmetrical Mach-Zehnder interference circuit 42. The oscillation light Re does not mix into the input waveguide 48 and output waveguide 51. The input signal light Ri and the output signal light Ro can be spatially separated from the oscillation light Re. For this reason, according to the optical amplifier shown in FIG. 3, no external filter for removing the oscillation light Re from the input signal light Ri and output signal light Ro is necessary.

The structure of the semiconductor optical amplifiers used in the above-described embodiment is not particularly limited. When the structure is used for all semiconductor optical amplifiers normally used, the above-described effect can be obtained.

For example, an arbitrary material such as InGaAsP, GaAs, AlGaAs, InGaAs, or GaInNAs can be used for the active layer of the semiconductor optical amplifier.

In addition, a bulk structure, MQW, quantum wire, quantum dot, or the like can be used for the active layer structure of the semiconductor optical amplifier. The same effect as described above can be expected even by forming a separate confinement heterostructure layer on the upper or lower side or both sides of the active layer. For the waveguide structure of the semiconductor optical amplifier, even when a p-n burying structure, ridge structure, semi-insulating buried structure, high mesa structure, or the like is used, the same effect as described above can be expected. The substrate is also not limited to the n-type substrate. A p-type substrate, semi-insulating substrate, or the like may be used.

In the above embodiment, a multi-mode interference 3-dB coupler is used as a 3-dB coupler. However, a directional coupler may be used. Additionally, the semiconductor optical amplifier 47 may be arranged on the oscillation light waveguide 49. Alternatively, the semiconductor optical amplifier 47 may be arranged on the loop waveguide 56.

Fourth Embodiment

Still another embodiment of the present invention will the described next.

Figure 8:
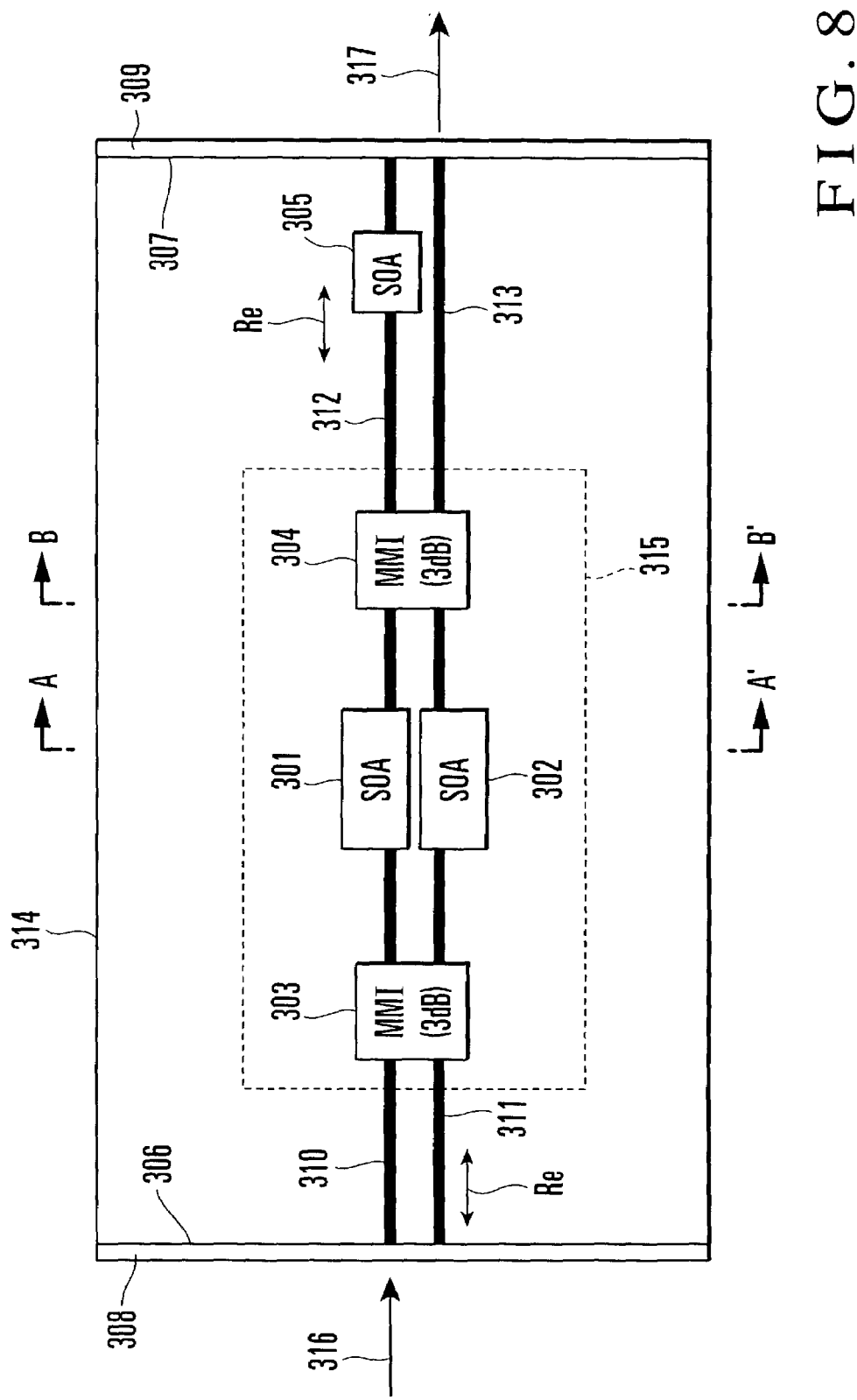
FIG. 8 is a plan view showing the arrangement of an optical amplifier according to another embodiment of the present invention.
Figure 9A:
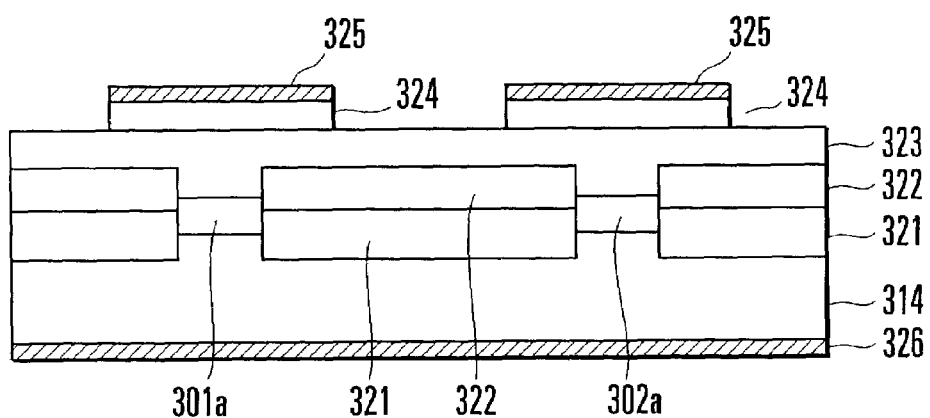
FIGS. 9A and 9B are sectional views schematically showing the sections of the optical amplifier shown in FIG. 8.
Figure 9B:
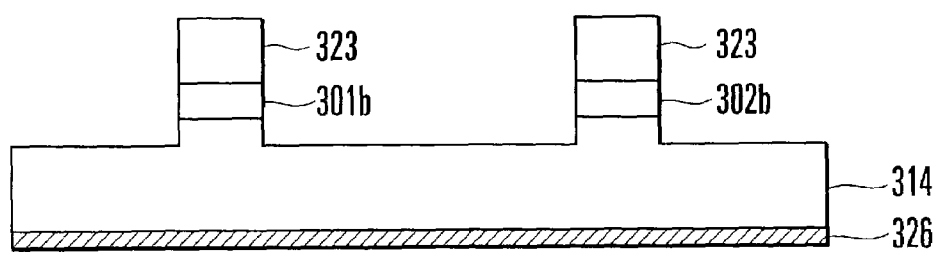

FIG. 8 shows the arrangement of an optical amplifier according to still another embodiment of the present invention. FIGS. 9A and 9B schematically show the sections of the optical amplifier. FIG. 9A shows a section taken along a line A–A' in FIG. 8. FIG. 9B shows a section taken along a line B–B' in FIG. 8. This optical amplifier comprises semiconductor optical amplifiers (SOAs) 301, 302, and 305, multi-mode interference 3-dB couplers (MMI couplers) 303 and 304, an input waveguide (input port) 310, oscillation light waveguides (ports) 311 and 312, and an output waveguide (output port) 313, which are formed on a substrate 314. These components are arranged between a waveguide end face 306 and a waveguide end face 307. Anti-reflection films 308 and 309 are formed on the waveguide end faces 306 and 307, respectively.

As shown in FIGS. 9A and 9B, active layers 301a and 302a made of InGaAsP as a gain medium are formed into stripes with predetermined lengths in a predetermined region on the substrate 314 made of, e.g., n-type InP. The active layers 301a and 302a run in the direction of a normal to the page surface of FIGS. 9A and 9B. The active layers 301a and 302a correspond to the SOAs 301 and 302 in FIG. 8. The active layers 301a and 302a are buried by a current blocking layer formed from a p-InP layer 321 and n-InP layer 322.

A cladding layer 323 made of p-InP is formed on the active layers 301a and 302a and n-InP layer 322. Cap layers 324 made of p-InGaAsP are formed on the cladding layer 323 in regions above the active layers 301a and 302a. A p-side electrode 325 is formed on each cap layer 324. An n-side electrode 326 is formed on the lower surface of the substrate 314.

In addition, cores 301b and 302b made of InGaAsP are formed to be connected to the active layers 301a and 302a in regions connected to the SOAs 301 and 302 on the substrate 314. The cladding layer 323 is formed on each of the cores 301b and 302b. The substrate 314 serving as a lower cladding, the cores 301b and 302b, and the cladding layers 323 form optical waveguide structures.

Even in the optical amplifier shown in FIG. 8, the SOAs 301 and 302 and MMI couplers 303 and 304 form a symmetrical Mach-Zehnder interference circuit 315. The operation principle of this circuit will be described below. Almost the same current is injected to the SOAs 301 and 302 connected to the two arms of the symmetrical Mach-Zehnder interference circuit 315, so both the SOAs 301 and 302 have a signal gain of 20 dB. Since almost the same current is injected to the SOAs 301 and 302, the symmetry of the symmetrical Mach-Zehnder interference circuit 315 is preserved. Because of the characteristic of the symmetrical Mach-Zehnder interference circuit 315, it is set in a cross state so that light incident from the input waveguide 310 emerges to the output waveguide 313, and light incident from the oscillation light waveguide 311 emerges to the oscillation light waveguide 312.

A current value is set for the SOA 305 connected to the oscillation light waveguide 312 such that the SOA 305 has a gain of 10 dB. The gain for light incident from the oscillation light waveguide 311 on the symmetrical Mach-Zehnder interference circuit 315 will be examined. Light incident from the oscillation light waveguide 311 is branched into two light components by the MMI coupler 303. The light components are amplified by 20 dB by the SOAs 301 and 302 and coupled to the oscillation light waveguide 312 through the MMI coupler 304 without any principle loss because of the characteristic of the symmetrical Mach-Zehnder interference circuit. The light that has been coupled to the oscillation light waveguide 312 is further amplified by 10 dB by the SOA 305 and reaches the end-face 307.

The anti-reflection film 309 made of a multilayered film of TiO$_2$ and SiO$_2$ is formed on the end face 307. The residual reflectance of the anti-reflection film 309 is normally about 0.1%. Hence, the light that has reached the end face 307 is reflected at the reflectance of 0.1%, amplified by 10 dB again by the SOA 305 and by 20 dB by the SOAs 301 and 302 arranged in the symmetrical Mach-Zehnder interference circuit 315 and reaches the oscillation light waveguide 311. Light reflected by the 0.1% residual reflectance of the anti-reflection film 308 formed on the end face 306 becomes incident from the oscillation light waveguide 311 on the symmetrical Mach-Zehnder interference circuit 315.

The power of the light that becomes incident from the oscillation light waveguide 311 on the symmetrical Mach-Zehnder interference circuit 315 for the first time will be compared with the power of the light that reciprocates while being reflected by the two end faces of the element and then becomes incident from the oscillation light waveguide 311 on the symmetrical Mach-Zehnder interference circuit 315 again. Since the light reciprocating is amplified by (20 dB+10 dB) twice, the gain is 60 dB (i.e., $10^6$). Since this light is reflected twice at a reflectance of 0.1% (i.e., $10^{-3}$), the loss is $10^{-6}$. Hence, the power of the light that has reciprocated once is just $10^6 \times 10^{-6} = 1$.

This indicates that even without any external optical input, the light can continuously be propagated inside and also that a cavity is generated in the optical path from the end face 306 to the end face 307 of the element through the oscillation light waveguide 311, symmetrical Mach-Zehnder interference circuit 315, oscillation light waveguide 312, and SOA 305 so as to cause oscillation. The carrier density in the gain medium in the oscillated state is clamped to a threshold carrier density. Hence, even when the amount of the current injected to the SOAs 301 and 302 is increased, the carrier density does not change. The gain does not change, either, and only the light intensity of oscillation light increases.

In this clamped state, when signal light 316 is incident from the input waveguide 310, the light is branched into two light components by the MMI coupler 303. The light components are amplified by 20 dB by the SOAs 301 and 302, coupled to the output waveguide 313 through the MMI coupler 304, and output from the output waveguide 313 without any principle loss because of the characteristic of the symmetrical Mach-Zehnder interference circuit 315. The total gain in this path is 20 dB on one way. For this reason, even when the 0.1% residual reflection by the end faces exists, no oscillation occurs. Hence, traveling wave optical amplification operation is performed. When the input signal light intensity increases, the oscillation light intensity decreases so that the total light intensity in the SOAs 301 and 302 is kept constant. For this, reason, the carrier density in the SOAs 301 and 302 does not vary, the gain is also kept constant, and the saturation characteristic shown in FIG. 7 is obtained. Even when the number of multiplexed wavelengths of the input signal changes, the gain does not change, and stable operation can be performed.

The gain adjustment method in the optical amplifier shown in FIG. 8 will be described below. When the gain on one way in the cavity formed by the optical path from the end face 306 to the end face 307 through the oscillation light waveguide 311, symmetrical Mach-Zehnder interference circuit 315, oscillation light waveguide 312, and SOA 305 becomes the reciprocal of the end face residual reflectance, oscillation starts, and the gain is clamped. In this case, when the sum of the gain of the SOA 301 or 302 and the gain of the SOA 305 is 30 dB, the gain is clamped.

When the gain of the SOA 305 is set to 10 dB, the gain of the SOAs 301 and 302 is clamped to 20 dB. In this way, when the gain of the SOA 305 is adjusted, the gain of the SOAs 301 and 302 that constitute the symmetrical Mach-Zehnder interference circuit 315 can be adjusted. For example, when the gain of the SOA 305 is set to 5 dB, the gain of the SOAs 301 and 302 can be clamped to 25 dB. The gain for the input signal 316 is determined by the SOAs 301 and 302. For this reason, when the gain of the SOA 305 is adjusted, the gain of the SOAs 301 and 302 is determined, and the gain of the optical amplification element of the present invention can be adjusted.

The wavelength relationship between oscillation light and signal light will be described next. As a characteristic feature of the operation mode of the optical amplifier according to the present invention, as described above, when the input signal light intensity increases, the oscillation light intensity decreases to keep the light intensity in the SOA constant. This is because the number of carriers necessary for amplifying signal light increases when the input signal light intensity increases, and carriers that have been consumed to increase the intensity of oscillation light are consumed to amplify the signal light.

To efficiently perform the above operation while keeping a high gain for signal light, the wavelength of oscillation light is preferably present on the short wavelength side of the gain center of the gain medium for amplifying the signal light. Hence, in this embodiment, the bandgap wavelength of the gain medium in the optical amplifier 305 serving as an intensity adjustment means is set to be shorter than that of the gain medium in the SOAs 301 and 302 serving as amplification means for amplifying signal light.

Figure 10:
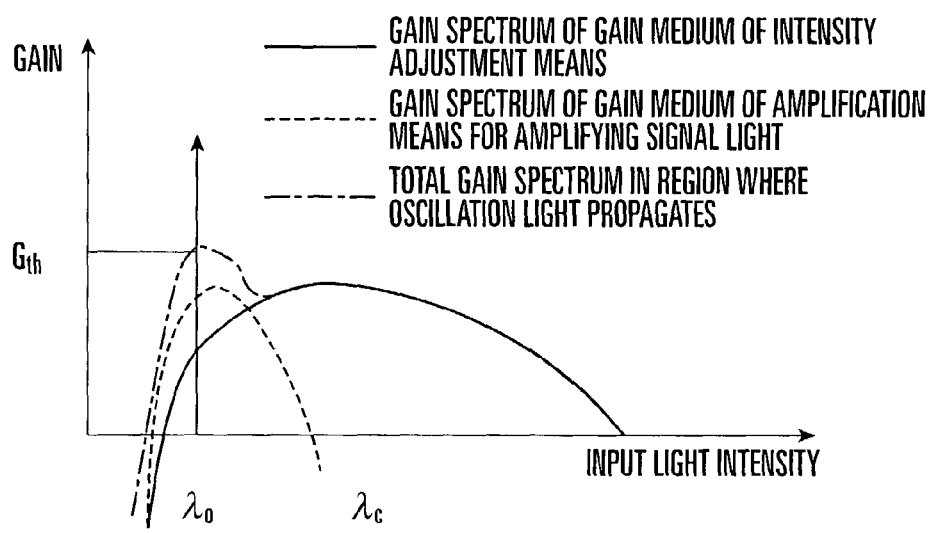
FIG. 10 is a graph showing the gain spectrum of the gain medium in each SOA.

This structure can be implemented by separately growing the gain medium (active layer) in two processes. The structure can also be implemented using the so-called selective growth technique in which the mask width is locally changed using a selective growth mask so as to locally change the composition or thickness of a crystal growing near the mask. With this technique, oscillation light and signal light obtain gains as shown in FIG. 10. Referring to FIG. 10, the solid line indicates the gain spectrum of the gain medium in the SOAs 301 and 302 serving as amplification means for amplifying signal light. The dotted line indicates the gain spectrum of the gain medium in the SOA 305 serving as an intensity adjustment means.

Since oscillation light passes through the SOA 301 or 302 serving as an amplification means for amplifying signal light and the SOA 305 serving as an intensity adjustment means, the spectrum of the total gain for the oscillation light changes as indicated by the alternate long and short dashed line in FIG. 10. The oscillation light is oscillated at its wavelength when the gain exceeds an oscillation threshold gain $G_{th}$. As a result, a wavelength.$_o$ of the oscillation light is set to be shorter than a gain center wavelength.$_c$ of the gain medium in the SOAs 301 and 302 serving as amplification means for amplifying the signal light, as shown in FIG. 10.

In this state, when the intensity of input signal light increases to reduce the number of necessary carriers, high-energy electrons, i.e., electrons that generate the gain on the short wavelength side can be supplied to the low energy side to quickly compensate for the gain on the long wavelength side. Hence, according to the optical amplifier shown in FIG. 8, the temporal variation in gain when the input intensity varies can be minimized.

In the optical amplifier shown in FIG. 8, the oscillation light is oscillated in the cavity formed by the optical path from the end face 306 to the end face 307 of the element through the oscillation light waveguide 311, symmetrical Mach-Zehnder interference circuit 315, oscillation light waveguide 312, and SOA 305 because of the characteristic of the symmetrical Mach-Zehnder interference circuit 315. The oscillation light does not mix into the input waveguide 310 and output waveguide 313 serving as the input and output ports for signal light. The signal light can be spatially separated from the oscillation light. As a consequence, in the optical amplifier shown in FIG. 8, no external filter for removing the oscillation light is necessary.

The above-described SOA structure is not particularly limited. When the structure is used for all SOAs normally used, the above-described effect can be expected. For example, an arbitrary material such as InGaAsP, GaAs, AlGaAs, InGaAs, or GaInNAs can be used for the active layer of the SOA. A bulk structure, MQW, quantum wire, quantum dot, or the like can be used for the active layer structure. The same effect as described above can be expected even by forming a separate confinement heterostructure layer on the upper or lower side or both sides of the active layer.

In addition, even when a p-n burying structure, ridge structure, semi-insulating buried structure, high mesa structure, or the like is used for the waveguide structure of the SOA, the same effect as described above can be expected. The substrate is not limited to the n-type substrate, either. The same effect as described above can be obtained even by using a p-type substrate, semi-insulating substrate, or the like.

In the above embodiment, an MMI coupler is used as a 3-dB coupler. However, a directional coupler may be used.

Fifth Embodiment

In the optical amplifier shown in FIG. 8, when the length of an SOA 305 (the length of a gain medium) serving as an intensity adjustment means is made smaller than that of the gain medium in SOAs 301 and 302 serving as amplification means for amplifying signal light, the effect described in the above embodiment can be expected. The principle will be described below.

Figure 11:
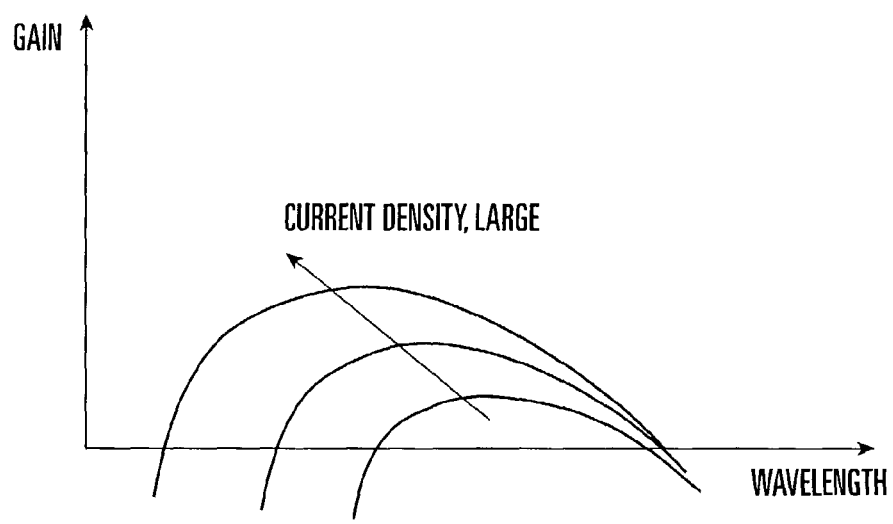
FIG. 11 is a graph showing the relationship between the current injection density and the gain spectrum.

FIG. 11 shows the relationship between the current injection density and the gain spectrum. As shown in FIG. 11, as the current injection density increases, the gain center shifts to the short wavelength side. Generally, a gain G of a SOA is given by "G=exp(.g–.)L" where is the light confinement coefficient into the gain medium, g is the gain coefficient of the gain medium, L is the length of the gain medium, and is the loss. Hence, when the length L of the gain medium in the SOA 305 serving as an intensity adjustment means is made smaller than the length of the gain medium in the SOAs 301 and 302 serving as amplification means for amplifying signal light, the current injection density must be increased to increase a gain coefficient g in order to ensure a sufficient gain of the SOA 305. Accordingly, the gain peak shifts to the short wavelength side.

When the length ratio between the SOAs 305 and 301, or 305 and 302 is set to an appropriate value, the spectrum of the total gain for oscillation light exhibits a shape obtained by adding the gain spectrum of the SOA 301 or 302 serving as an amplification means for amplifying signal light and the gain spectrum of the SOA 305 serving as an intensity adjustment means, which shifts to the short wavelength side, in accordance with their length ratio. This state is indicated by the alternate long and short dashed line in FIG. 10.

Hence, the effect that a variation in gain when the input intensity varies is minimized, as described above, can be expected also in this embodiment in which the SOA 305 is shortened.

The SOA structure used in this arrangement is not particularly limited, as in the optical amplifier shown in FIG. 8. When the structure is used for all SOAs normally used, the above-described effect can be expected. For example, an arbitrary material such as InGaAsP, GaAs, AlGaAs, InGaAs, or GaInNAs can be used for the active layer of the SOA. A bulk structure, MQW, quantum wire, quantum dot, or the like can be used for the active layer structure. The same effect as described above can be expected even by forming a separate confinement heterostructure layer on the upper or lower side or both sides of the active layer. In addition, even when a p-n burying structure, ridge structure, semi-insulating buried structure, high mesa structure, or the like is used for the waveguide structure of the SOA, the same effect as described above can be expected. The substrate is not limited to the n-type substrate, either. The same effect as described above can be obtained even by using a p-type substrate, semi-insulating substrate, or the like.

Sixth Embodiment

Figure 12:
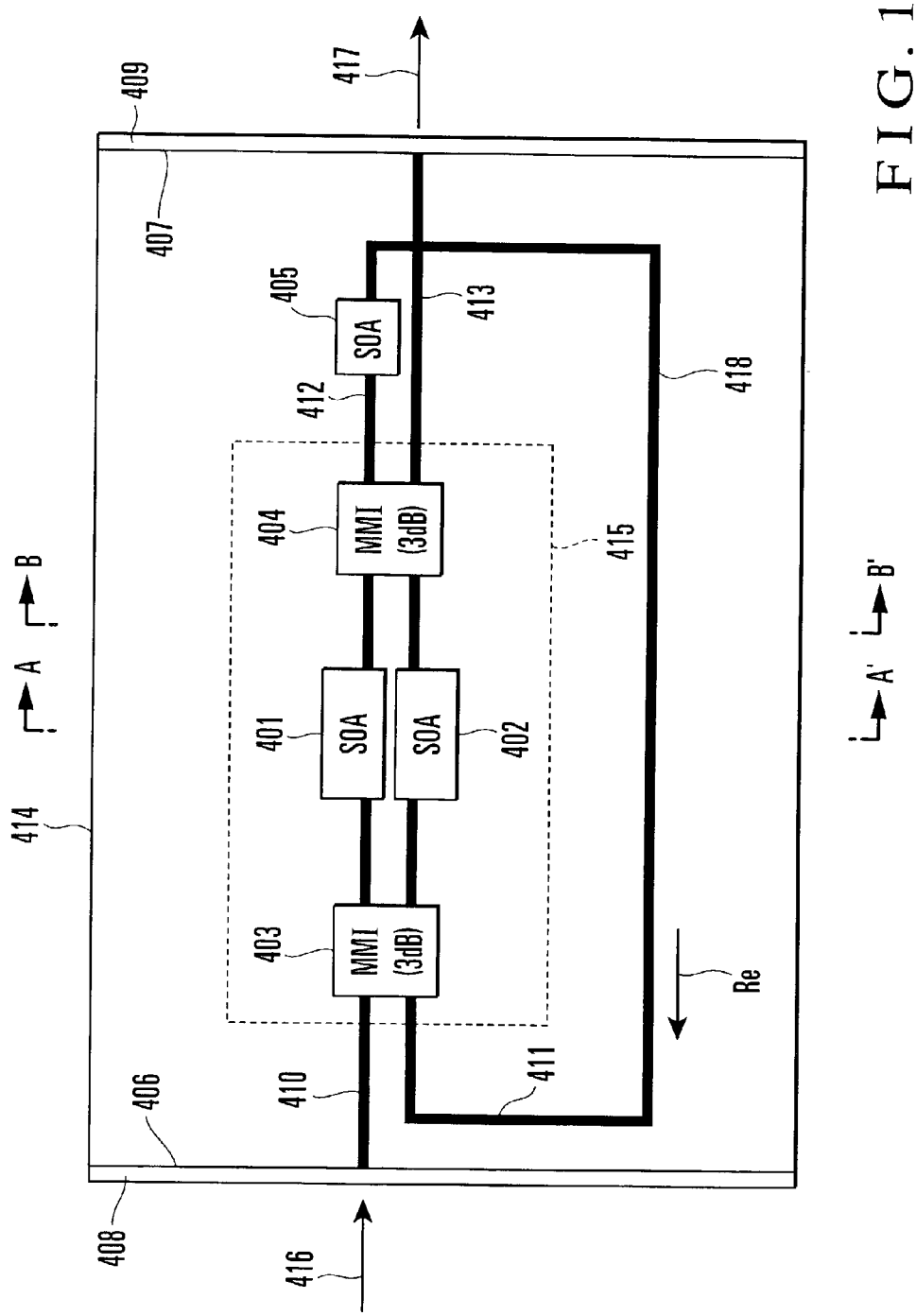
FIG. 12 is a plan view showing the arrangement of an optical amplifier according to still another embodiment of the present invention.
Figure 13A:
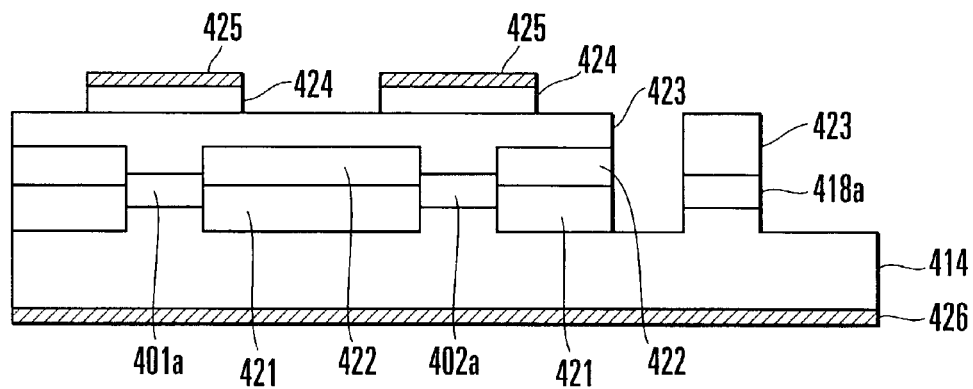
FIGS. 13A and 13B are sectional views schematically showing the sections of the optical amplifier shown in FIG. 12.
Figure 13B:
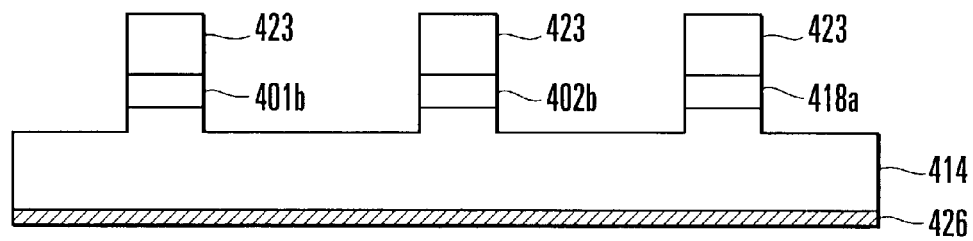

Still another embodiment of the present invention will be described next. FIG. 12 shows the arrangement of an optical amplifier according to this embodiment. FIGS. 13A and 13B schematically show the sections of the optical amplifier. FIG. 13A shows a section taken along a line A–A' in FIG. 12. FIG. 13B shows a section taken along a line B–B' in FIG. 12. This optical amplifier comprises SOAs 401, 402, and 405, multi-mode interference 3-dB couplers (MMI couplers) 403 and 404, an input waveguide 410, oscillation light waveguides 411 and 412, and an output waveguide 413, which are formed on a substrate 414. These components are arranged between a waveguide end face 406 and a waveguide end face 407. Anti-reflection films 408 and 409 are formed on the waveguide end faces 406 and 407, respectively. In addition, in this embodiment, the oscillation light waveguide 411 and oscillation light waveguide 412 are connected through a loop waveguide 418.

As shown in FIGS. 13A and 13B, active layers 401a and 402a made of InGaAsP as a gain medium are formed into stripes with predetermined lengths in a predetermined region on the substrate 414 made of, e.g., n-type InP. The active layers 401a and 402a run in the direction of a normal to the page surface of FIGS. 13A and 13B. The active layers 401a and 402a correspond to the SOAs 401 and 402 in FIG. 12. The active layers 401a and 402a are buried by a current blocking layer formed from a p-InP layer 421 and n-InP layer 422.

A cladding layer 423 made of p-InP is formed on the active layers 401a and 402a and n-InP layer 422. Cap layers 424 made of p-InGaAsP are formed on the cladding layer 423 in regions above the active layers 401a and 402a. A p-side electrode 425 is formed on each cap layer 424. An n-side electrode 426 is formed on the lower surface of the substrate 414.

In addition, cores 401b and 402b made of InGaAsP are formed to be connected to the active layers 401a and 402a in regions connected to the SOAs 401 and 402 on the substrate 414. The cladding layer 423 is formed on each of these cores. On the other hand, a core 418a made of InGaAsP is formed in another region on the substrate 414. The cladding layer 423 is also formed on this core 418a. The substrate 414 serving as a lower cladding, and the cores 401b, 402b, and 418a form three optical waveguide structures. In addition, the core 418a forms the loop waveguide 418.

The operation principle is the same as that of the optical amplifier shown in FIG. 8 except that the cavity for oscillation light is formed by the loop circuit starting from the waveguide 411 and reaching it again through a symmetrical Mach-Zehnder interference circuit 415, waveguide 412, SOA 405, and loop waveguide 418.

To operate the optical amplifier shown in FIG. 12 in a high gain state with respect to signal light, the propagation loss of the loop waveguide 418 is set to be relatively large. For example, the propagation loss of the loop waveguide 418 is set to about 30 dB. When the injection current to the SOA 405 is adjusted to obtain a gain of 10 dB, the loss of the loop circuit starting from the waveguide 411 and reaching it again through the symmetrical Mach-Zehnder interference circuit 415, waveguide 412, SOA 405, and loop waveguide 418 becomes 20 dB. In this state, when the gain in the symmetrical Mach-Zehnder interference circuit 415 is 20 dB, the product of the loss and gain in the loop circuit is 1, and oscillation occurs. In this state, even when the injection current to the SOAs 401 and 402 is increased, the gain is clamped to 20 dB, and the gain for input signal light 416 is also clamped to 20 dB, as in the optical amplifier shown in FIG. 8.

In the optical amplifier shown in FIG. 12 as well, when the gain of the SOA 405 is adjusted, the gain for the input signal light 416 can be adjusted due to the same reason as in the optical amplifier shown in FIG. 8. In addition, since oscillation light can be spatially separated from signal light, no external filter for removing oscillation light is necessary.

Even in this arrangement, when the bandgap wavelength of the gain medium in the SOA 405 serving as an intensity adjustment means is set to be shorter than that of the gain medium in the SOAs 401 and 402 serving as amplification means for amplifying signal light, the effect that the temporal variation in gain when the input intensity varies is minimized can be expected due to the same reason as in the optical amplifier shown in FIG. 8.

The SOA structure used in this arrangement is not particularly limited, as in the optical amplifier shown in FIG. 8. When the structure is used for all SOAs normally used, the above-described effect can be expected. For example, an arbitrary material such as InGaAsP, GaAs, AlGaAs, InGaAs, or GaInNAs can be used for the active layer of the SOA. A bulk structure, MQW, quantum wire, quantum dot, or the like can be used for the active layer structure. The same effect as described above can be expected even by forming a separate confinement heterostructure layer on the upper or lower side or both sides of the active layer. In addition, even when a p-n burying structure, ridge structure, semi-insulating buried structure, high mesa structure, or the like is used for the waveguide structure of the SOA, the same effect as described above can be expected. The substrate is also not limited to the n-type substrate. The same effect as described above can be obtained even by using a p-type substrate, semi-insulating substrate, or the like.

The same effect as described above can also be expected by connecting an optical attenuator, optical modulator, or the like to the loop waveguide 418 instead of setting a large propagation loss for the loop waveguide 418. The same effect as described above can also be expected even by using a directional coupler in place of an MMI coupler.

Seventh Embodiment

In the optical amplifier shown in FIG. 12, when the length of an SOA 405 is made smaller than that of the gain medium in SOAs 401 and 402, the effect described in the above embodiment can be expected.

As described with reference to FIG. 11, when the length of the SOA 405 serving as an intensity adjustment means is made smaller than the length of the gain medium in the SOAs 401 and 402 serving as amplification means for amplifying signal light, the current injection density must be increased to increase a gain coefficient in order to ensure a sufficient gain of the SOA 405. Accordingly, the gain peak shifts to the short wavelength side.

When the length ratio between the SOAs 405 and 401, or 405 and 402 is set to an appropriate value, the spectrum of the total gain for oscillation light exhibits a shape obtained by adding the gain spectrum of the SOA 401 or 402 and the gain spectrum of the SOA 405, which shifts to the short wavelength side, in accordance with their length ratio. This state is indicated by the alternate long and short dashed line in FIG. 10.

Hence, the effect that a temporal variation in gain when the input intensity varies is minimized, as described above, can be expected also in this embodiment in which the SOA 405 is shortened.

The SOA structure used in this arrangement is not particularly limited, as in the optical amplifier of each of the above embodiments. When the structure is used for all SOAs normally used, the above-described effect can be expected. For example, an arbitrary material such as InGaAsP, GaAs, AlGaAs, InGaAs, or GaInNAs can be used for the active layer of the SOA. A bulk structure, MQW, quantum wire, quantum dot, or the like can be used for the active layer structure. The same effect as described above can be expected even by forming a separate confinement heterostructure layer on the upper or lower side or both sides of the active layer. In addition, even when a p-n burying structure, ridge structure, semi-insulating buried structure, high mesa structure, or the like is used for the waveguide structure of the SOA, the same effect as described above can be expected. The substrate is also not limited to the n-type substrate. The same effect as described above can be obtained even by using a p-type substrate, semi-insulating substrate, or the like.

Eighth Embodiment

Figure 14:
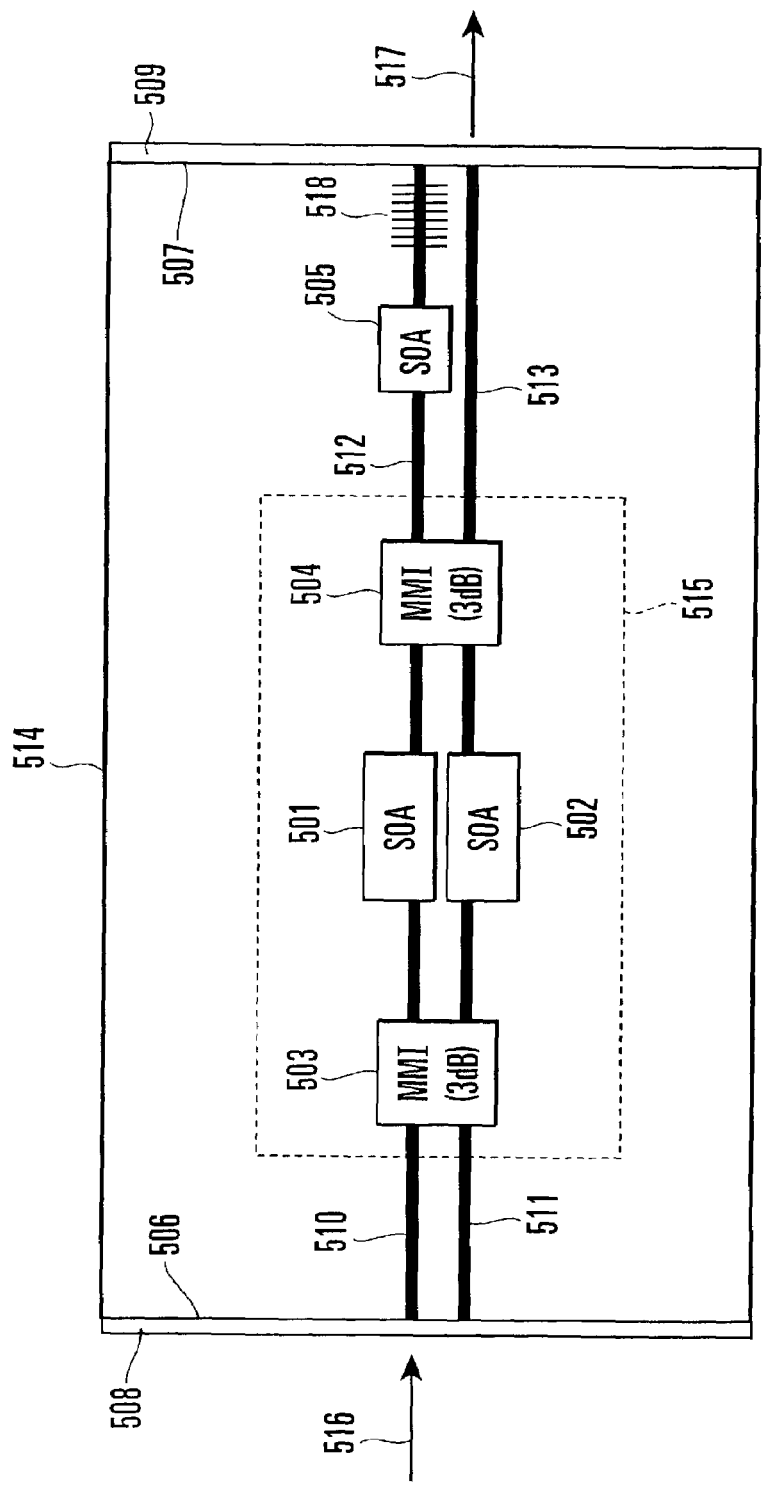
FIG. 14 is a plan view showing the arrangement of an optical amplifier according to still another embodiment of the present invention.

Still another embodiment of the present invention will be described next. FIG. 14 shows the arrangement of an optical amplifier according to still another embodiment of the present invention. This optical amplifier comprises SOAs 501, 502, and 505, multi-mode interference 3-dB couplers (MMI couplers) 503 and 504, an input waveguide 510, oscillation light waveguides 511 and 512, an output waveguide 513, and a grating 518, which are formed on a substrate 514. These components are arranged between a waveguide end face 506 and a waveguide end face 507. Anti-reflection films 508 and 509 are formed on the waveguide end faces 506 and 507, respectively.

In the optical amplifier shown in FIG. 14 as well, a symmetrical Mach-Zehnder interference circuit 515 is formed by the SOAs 501 and 502 and MMI couplers 503 and 504. The operation principle is the same as that of the optical amplifier shown in FIG. 8 except that the cavity for oscillation light is formed by an optical path from the element end face 506 to the grating 518 through the input waveguide 510, symmetrical Mach-Zehnder interference circuit 515, oscillation light waveguide 512, and SOA 505, and the wavelength of oscillation light is determined by the Bragg wavelength of the grating 518. The reflectance of the grating 518 is higher than the residual reflectance of the anti-reflection film 509 formed on the end face 507. The residual reflectance of the anti-reflection film 509 can substantially be neglected.

In this arrangement, when the reflectance of the grating 518 is set to, e.g., about 1%, and the residual reflectance of the anti-reflection film 508 formed on the element end face 506 is 0.1%, the total loss in the cavity is $10^{-5}$ as the sum of 1% and 0.1%. For this reason, the total gain of the symmetrical Mach-Zehnder interference circuit 515 and SOA 505 for the reciprocation is clamped at 50 dB. That is, the gain on one way is 25 dB, at which oscillation occurs, and the gain is clamped. For example, when the gain of the SOA 505 is set to 5 dB, the gain of the SOAs 501 and 502 is clamped to 20 dB, and the gain of input signal light 516 is also clamped to 20 dB.

In the optical amplifier shown in FIG. 14 as well, when the gain of the SOA 505 is adjusted, the gain for the input signal light 516 can be adjusted due to the same reason as in the optical amplifier shown in FIG. 8. In addition, since oscillation light can be spatially separated from signal light, no external filter for removing oscillation light is necessary.

Furthermore, when the Bragg wavelength of the grating 518 is set to the short wavelength side of the gain center of the SOA 501 or 502, the wavelength of oscillation light is set on the short wavelength side of the gain center to the SOA 501 or 502. Due to the same reason as in the optical amplifier shown in FIG. 8, the effect that a temporal variation in gain when the input intensity varies is minimized can be expected.

The SOA structure used in this arrangement is not particularly limited, as in the optical amplifier of each of the above-described embodiments. When the structure is used for all SOAs normally used, the above-described effect can be expected. For example, an arbitrary material such as InGaAsP, GaAs, AlGaAs, InGaAs, or GaInNAs can be used for the active layer of the SOA. A bulk structure, MQW, quantum wire, quantum dot, or the like can be used for the active layer structure. The same effect as described above can be expected even by forming a separate confinement heterostructure layer on the upper or lower side or both sides of the active layer.

In addition, when a p-n burying structure, ridge structure, semi-insulating buried structure, high mesa structure, or the like is used for the waveguide structure of the SOA, the same effect as described above can be expected. The substrate is also not limited to the n-type substrate. The same effect as described above can be obtained even by using a p-type substrate, semi-insulating substrate, or the like. The same effect as described above can also be expected even by using a directional coupler in place of an MMI coupler.

Ninth Embodiment

Figure 15:
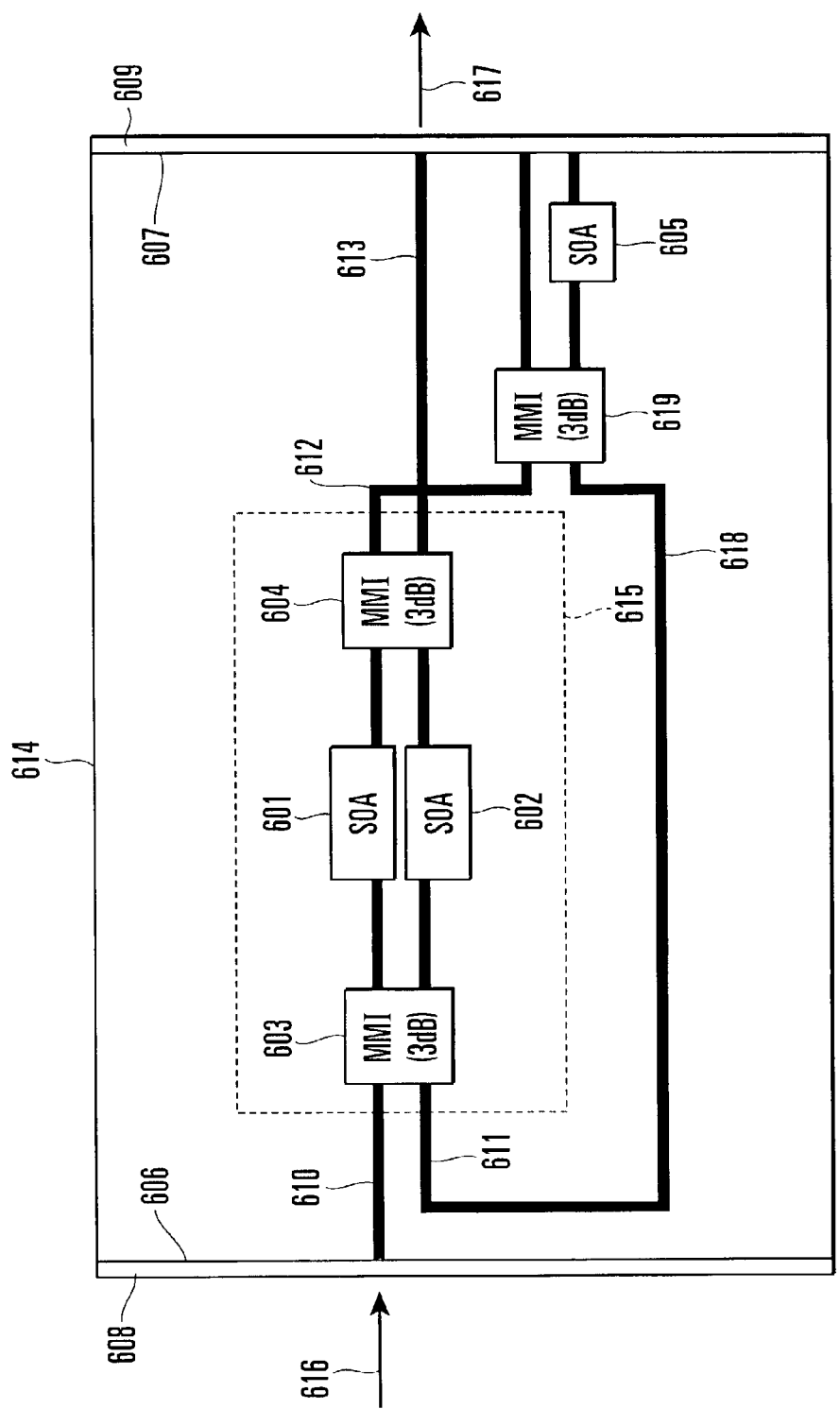
FIG. 15 is a plan view showing the arrangement of an optical amplifier according to still another embodiment of the present invention.

FIG. 15 shows the arrangement of an optical amplifier according to still another embodiment of the present invention. This optical amplifier comprises SOAs 601, 602, and 605, multi-mode interference 3-dB couplers (MMI couplers) 603 and 604, an input waveguide 610, oscillation light waveguides 611 and 612, an output waveguide 613, a loop waveguide 618, and an MMI coupler 619, which are formed on a substrate 614. These components are arranged between a waveguide end face 606 and a waveguide end face 607. Anti-reflection films 608 and 609 are formed on the waveguide end faces 606 and 607, respectively.

In the optical amplifier shown in FIG. 15, a symmetrical Mach-Zehnder interference circuit 615 is formed by the SOAs 601 and 602 and MMI couplers 603 and 604. The operation principle is the same as that of the optical amplifier shown in FIG. 8 except that the cavity for oscillation light is formed by a loop mirror from the anti-reflection film 609 and end face 607 to the oscillation light waveguides 611 and 612 and symmetrical Mach-Zehnder interference circuit 615 through the SOA 605, MMI coupler 619, and loop waveguide 618.

In the optical amplifier shown in FIG. 15, light that becomes incident on the MMI coupler 619 through the SOA 605 is branched into two light components. One light component becomes incident from the oscillation light waveguide 612 on the symmetrical Mach-Zehnder interference circuit 615, passes through the oscillation light waveguide 611 and loop waveguide 618 in this order, and returns to the MMI coupler 619 again while propagating through the loop counterclockwise. The other of the two branched light components propagates through the loop clockwise through the loop waveguide 618, oscillation light waveguide 611, symmetrical Mach-Zehnder interference circuit 615, and oscillation light waveguide 612 in this order and becomes incident on the MMI coupler 619 again.

The clockwise light component and counterclockwise light component interfere with each other in the MMI coupler 619, are guided to the SOA 605 without any loss, amplified by the SOA 605, reflected by the end face 607, and then become incident on the SOA 605 again. For example, assume that the reflectance of the anti-reflection film 609 is 0.1%. The injection current to the SOA 605 is adjusted to set the gain to 5 dB. When the gain in the symmetrical Mach-Zehnder interference circuit 615 is 20 dB, the product of the loss and gain in the cavity formed from the loop mirror and anti-reflection film is 1, and therefore, oscillation occurs.

Even when the injection current to the SOAs 601 and 602 is increased in this state, the gain is clamped to 20 dB. The gain for input signal light 616 is also clamped to 20 dB, as in the optical amplifier shown in FIG. 8.

In the optical amplifier shown in FIG. 15 as well, when the gain of the SOA 605 is adjusted, the gain for the input signal light 616 can be adjusted due to the same reason as in the optical amplifier shown in FIG. 8. In addition, since oscillation light can be spatially separated from signal light, no external filter for removing oscillation light is necessary.

Even in the optical amplifier shown in FIG. 15, when the bandgap wavelength of the gain medium in the SOA 605 serving as an intensity adjustment means is set to be shorter than that of the gain medium in the SOAs 601 and 602 serving as amplification means for amplifying signal light, the effect that the temporal variation in gain when the input intensity varies is minimized can be expected.

The SOA structure used in this arrangement is not particularly limited, as in the optical amplifier in each of the above-described embodiments. When the structure is used for all SOAs normally used, the above-described effect can be expected. For example, an arbitrary material such as InGaAsP, GaAs, AlGaAs, InGaAs, or GaInNAs can be used for the active layer of the SOA. A bulk structure, MQW, quantum wire, quantum dot, or the like can be used for the active layer structure. The same effect as described above can be expected even by forming a separate confinement heterostructure layer on the upper or lower side or both sides of the active layer.

In addition, when a p-n burying structure, ridge structure, semi-insulating buried structure, high mesa structure, or the like is used for the waveguide structure of the SOA, the same effect as described above can be expected. The substrate is also not limited to the n-type substrate. The same effect as described above can be obtained even by using a p-type substrate, semi-insulating substrate, or the like.

The same effect as described above can also be expected even by using a directional coupler in place of an MMI coupler.

10th Embodiment

Figure 16:
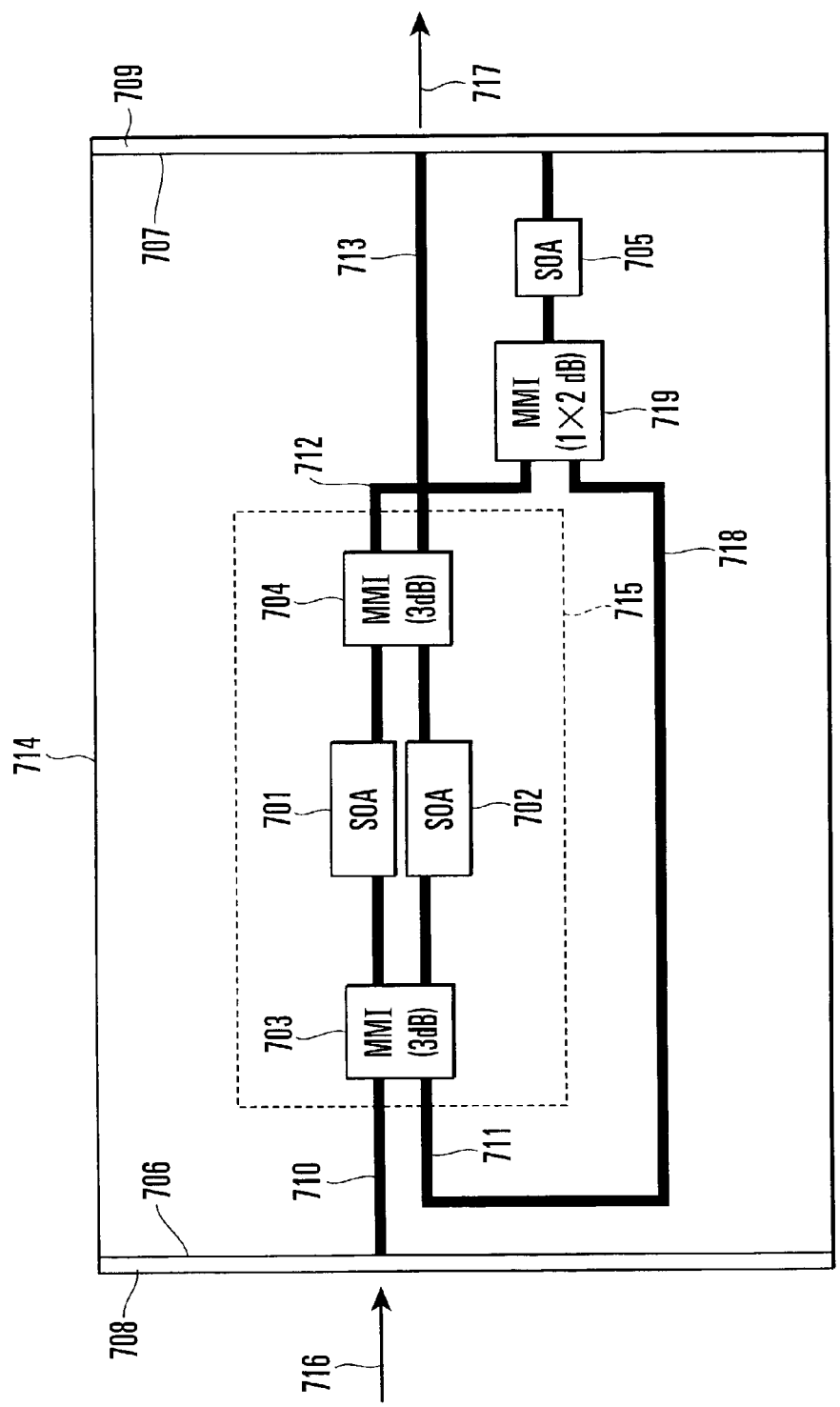
FIG. 16 is a plan view showing the arrangement of an optical amplifier according to still another embodiment of the present invention.

In the optical amplifier shown in FIG. 15, even when an MMI coupler with a 1×2 structure may be used in place of an MMI coupler 619 with a 2×2 structure, the same effect as described above can be obtained. FIG. 16 shows the arrangement of an optical amplifier according to still another embodiment of the present invention. This optical amplifier comprises SOAs 701, 702, and 705, multi-mode interference 3-dB couplers (MMI couplers) 703 and 704, an input waveguide 710, oscillation light waveguides 711 and 712, an output waveguide 713, a loop waveguide 718, and an MMI coupler 719, which are formed on a substrate 714. These components are arranged between a waveguide end face 706 and a waveguide end face 707. Anti-reflection films 708 and 709 are formed on the waveguide end faces 706 and 707, respectively. In this embodiment, the MMI coupler 719 has a 1×2 structure, as described above.

The operation principle of the optical amplifier shown in FIG. 16 is the same as that of the optical amplifier shown in FIG. 15 except that the cavity for oscillation light is formed by a loop mirror from the anti-reflection film 709 and end face 707 to the oscillation light waveguides 711 and 712 and symmetrical Mach-Zehnder interference circuit 715 through the SOA 705, MMI coupler 719 having the 1×2 structure, and loop waveguide 718.

In the optical amplifier shown in FIG. 16 as well, when the gain of the SOA 705 is adjusted, the gain for input signal light 716 can be adjusted due to the same reason as in the optical amplifier shown in FIG. 8. In addition, since oscillation light can be spatially separated from signal light, no external filter for removing oscillation light is necessary. In addition, when the bandgap wavelength of the gain medium in the SOA 705 serving as an intensity adjustment means is set to be shorter than that of the gain medium in the SOAs 701 and 702 serving as amplification means for amplifying signal light, the effect that the temporal variation in gain when the input intensity varies is minimized can be expected.

The SOA structure used in this arrangement is not particularly limited, as in the optical amplifier in each of the above-described embodiments. When the structure is used for all SOAs normally used, the above-described effect can be expected. For example, an arbitrary material such as InGaAsP, GaAs, AlGaAs, InGaAs, or GaInNAs can be used for the active layer of the SOA. A bulk structure, MQW, quantum wire, quantum dot, or the like can be used for the active layer structure. The same effect as described above can be expected even by forming a separate confinement heterostructure layer on the upper or lower side or both sides of the active layer.

In addition, when a p-n burying structure, ridge structure, semi-insulating buried structure, high mesa structure, or the like is used for the waveguide structure of the SOA, the same effect as described above can be expected. The substrate is also not limited to the n-type substrate. The same effect as described above can be obtained even by using a p-type substrate, semi-insulating substrate, or the like.

The same effect as described above can also be expected even by using a directional coupler in place of an MMI coupler. The same effect as described above can also be expected even when the MMI coupler having the 1×2 structure is replaced with a Y branch.

11th Embodiment

In the optical amplifier shown in FIG. 15 or 16, when SOA 605 or 705 serving as an intensity adjustment means is set to be shorter than that of the gain medium in SOAs 601 and 602 or SOAs 701 and 702 serving as amplification means for amplifying signal light, the effect that the temporal variation in gain when the input intensity varies is minimized can be expected, as described with reference to FIG. 11.

12th Embodiment

Figure 17:
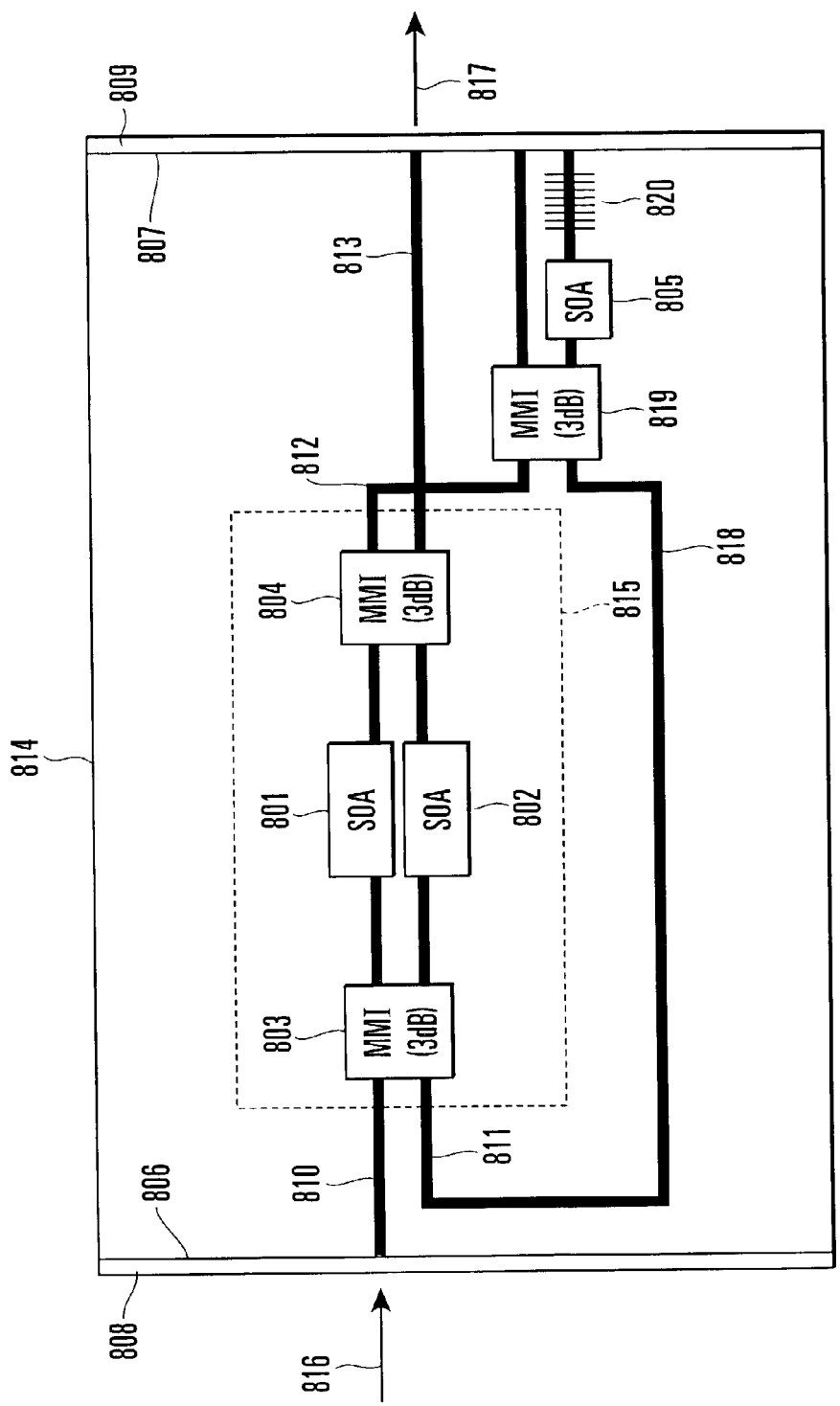
FIG. 17 is a plan view showing the arrangement of an optical amplifier according to still another embodiment of the present invention.

FIG. 17 shows the arrangement of an optical amplifier according to still another embodiment of the present invention. This optical amplifier comprises SOAs 801, 802, and 805, multi-mode interference 3-dB couplers (MMI couplers) 803 and 804, an input waveguide 810, oscillation light waveguides 811 and 812, an output waveguide 813, a loop waveguide 818, an MMI coupler 819, and a grating 820, which are formed on a substrate 814. These components are arranged between a waveguide end face 806 and a waveguide end face 807. Anti-reflection films 808 and 809 are formed on the waveguide end faces 806 and 807, respectively.

A symmetrical Mach-Zehnder interference circuit 815 is formed by the SOAs 801 and 802 and MMI couplers 803 and 804. The operation principle is the same as that of the optical amplifier shown in FIG. 8 except that the cavity for oscillation light is formed by a loop mirror from the grating 820 to the oscillation light waveguides 811 and 812 and symmetrical Mach-Zehnder interference circuit 815 through the SOA 805, MMI coupler 819, and loop waveguide 818.

In the optical amplifier shown in FIG. 17, light that becomes incident from the SOA 805 on the MMI coupler 819 is branched into two light components. One light component becomes incident from the waveguide 812 on the symmetrical Mach-Zehnder interference circuit 815, passes through the waveguides 811 and 818 in this order, and returns to the MMI coupler again while propagating through the loop counterclockwise. The other of the two branched light components propagates through the loop clockwise through the waveguides 818 and 811, symmetrical Mach-Zehnder interference circuit 815, and waveguide 812 in this order and becomes incident on the MMI coupler 819 again.

The clockwise light component and counterclockwise light component interfere each other in the MMI coupler 819, are guided to the SOA 805 without any loss, amplified by the SOA 805, reflected by the grating 820, and then becomes incident on the SOA 805 again. For example, assume that the reflectance of the grating 820 is 0.1%. The injection current to the SOA 805 is adjusted to set the gain to 5 dB. When the gain in the symmetrical Mach-Zehnder interference circuit 815 is 20 dB, the product of the loss and gain in the cavity formed from the loop mirror and anti-reflection film is 1, and therefore, oscillation occurs.

Even when the injection current to the SOAs 801 and 802 is increased in this state, the gain is clamped to 20 dB. The gain for input signal light 816 is also clamped to 20 dB, as in the optical amplifier shown in FIG. 1.

In the optical amplifier of this embodiment shown in FIG. 17 as well, when the gain of the SOA 805 is adjusted, the gain for the input signal light 816 can be adjusted due to the same reason as in the optical amplifier shown in FIG. 1. In addition, since oscillation light can be spatially separated from signal light, no external filter for removing oscillation light is necessary.

Furthermore, when the Bragg wavelength of the grating 820 is set to the short wavelength side of the gain center of the SOA 801 or 802, the wavelength of oscillation light is set on the short wavelength side of the gain center to the SOA 801 or 802. Hence, the effect that a temporal variation in gain when the input intensity varies is minimized can be expected.

The SOA structure used in this arrangement is not particularly limited, as in the optical-amplifier of each of the above-described embodiments. When the structure is used for all SOAs normally used, the above-described effect can be expected. For example, an arbitrary material such as InGaAsP, GaAs, AlGaAs, InGaAs, or GaInNAs can be used for the active layer of the SOA. A bulk structure, MQW, quantum wire, quantum dot, or the like can be used for the active layer structure. The same effect as described above can be expected even by forming a separate confinement heterostructure layer on the upper or lower side or both sides of the active layer.

In addition, when a p-n burying structure, ridge structure, semi-insulating buried structure, high mesa structure, or the like is used for the waveguide structure of the SOA, the same effect as described above can be expected. The substrate is also not limited to the n-type substrate. The same effect as described above can be obtained even by using a p-type substrate, semi-insulating substrate, or the like. The same effect as described above can also be expected even by using a directional coupler in place of an MMI coupler.

13th Embodiment

Figure 18:
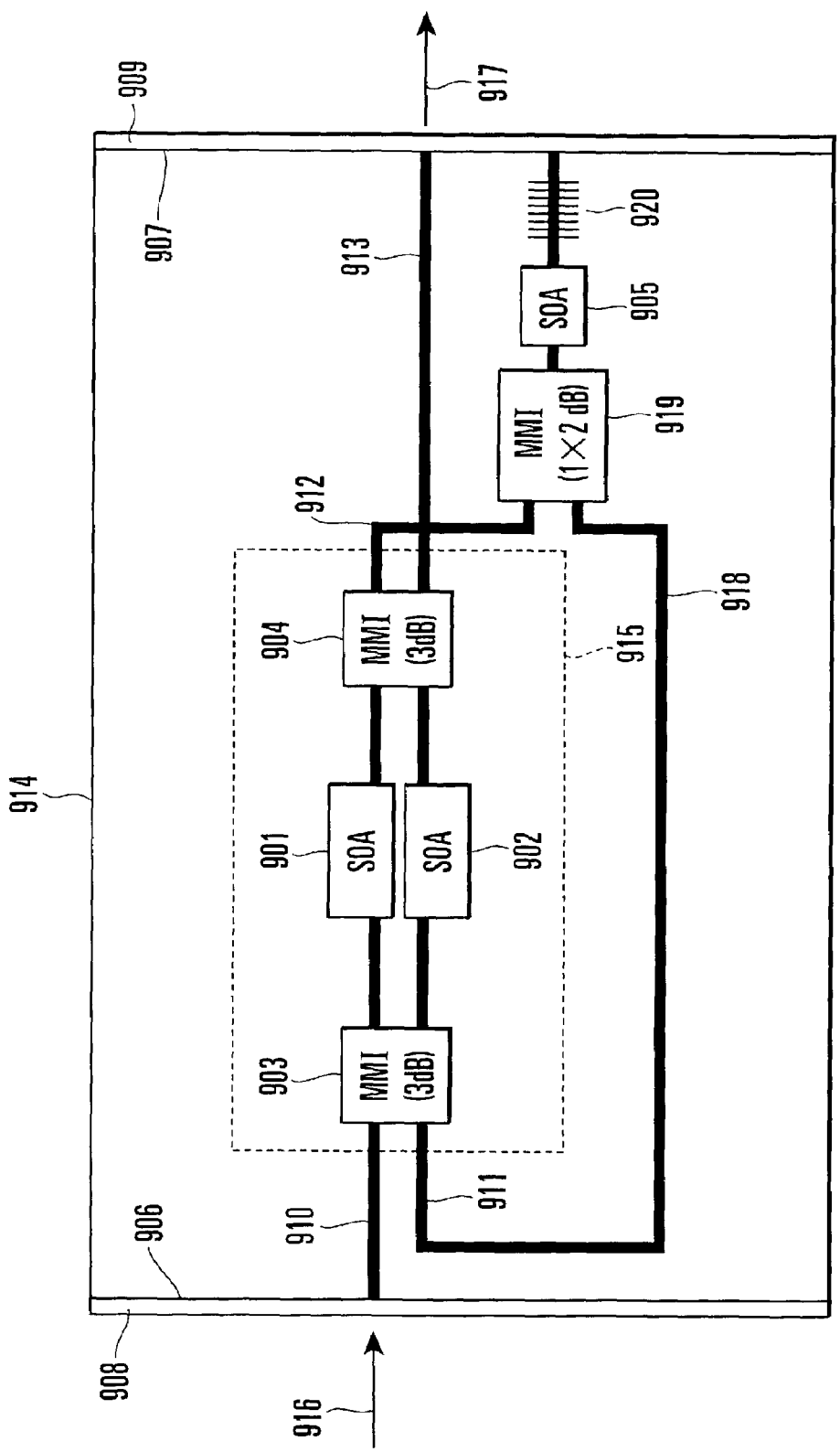
FIG. 18 is a plan view showing the arrangement of an optical amplifier according to still another embodiment of the present invention.

FIG. 18 shows the arrangement of an optical amplifier according to still another embodiment of the present invention. This optical amplifier comprises SOAs 901, 902, and 905, multi-mode interference 3-dB couplers (MMI couplers) 903 and 904, an input waveguide 910, oscillation light waveguides 911 and 912, an output waveguide 913, a loop waveguide 918, an MMI coupler 919, and a grating 920, which are formed on a substrate 914. These components are arranged between a waveguide end face 906 and a waveguide end face 907. Anti-reflection films 908 and 909 are formed on the waveguide end faces 906 and 907, respectively. In the optical amplifier of this embodiment shown in FIG. 19, the MMI coupler 919 has a 1×2 structure.

The operation principle of this optical amplifier is the same as that of the optical amplifier shown in FIG. 17 except that the cavity for oscillation light is formed by a loop mirror from the grating 920 to the oscillation light waveguides 911 and 912 and symmetrical Mach-Zehnder interference circuit 915 through the SOA 905, MMI coupler 919 having the 1×2 structure, and loop waveguide 918.

In the optical amplifier of this embodiment shown in FIG. 18 as well, when the gain of the SOA 905 is adjusted, the gain for input signal light 916 can be adjusted due to the same reason as in the optical amplifier shown in FIG. 8. In addition, since oscillation light can be spatially separated from signal light, no external filter for removing oscillation light is necessary.

Furthermore, even in this embodiment, when the Bragg wavelength of the grating 920 is set to the short wavelength side of the gain center of the SOA 901 or 902, the wavelength of oscillation light is set on the short wavelength side of the gain center to the SOA 901 or 902. Hence, the effect that a temporal variation in gain when the input intensity varies is minimized can be expected, as in the optical amplifier shown in FIG. 17.

The SOA structure used in this arrangement is not particularly limited, as in the optical amplifier of each of the above-described embodiments. When the structure is used for all SOAs normally used, the above-described effect can be expected. For example, an arbitrary material such as InGaAsP, GaAs, AlGaAs, InGaAs, or GaInNAs can be used for the active layer of the SOA. A bulk structure, MQW, quantum wire, quantum dot, or the like can be used for the active layer structure. The same effect as described above can be expected even by forming a separate confinement heterostructure layer on the upper or lower side or both sides of the active layer.

In addition, when a p-n burying structure, ridge structure, semi-insulating buried structure, high mesa structure, or the like is used for the waveguide structure of the SOA, the same effect as described above can be expected. The substrate is also not limited to the n-type substrate. The same effect as described above can be obtained even by using a p-type substrate, semi-insulating substrate, or the like. The same effect as described above can also be expected even by using a directional coupler in place of an MMI coupler. In addition, the same effect as described above can also be expected even when a Y branch is used in placed of the MMI 1×2 coupler.

As has been described above, according to the present invention, input signal light can be amplified in a gain medium in which the gain is clamped by oscillation while spatially separating the optical path which guides oscillation light from the optical path which guides signal light. No wavelength filter for separating signal light from oscillation light is necessary. In addition, any variation in gain depending on the input light intensity can be suppressed.

What is claimed is:

1. An optical amplifier which amplifies a light intensity of input signal light having an arbitrary wavelength, comprising:
    optical combining/distributing means for combining the input signal light with an oscillation signal light and distributing the input signal light to a plurality of input ports;
    amplification means for amplifying the light intensity of the distributed input signal light and the oscillation signal light;
    optical coupling/distributing means for combining a plurality of output light beams from said amplification means and distributing the output light beams into a plurality of output ports;
    intensity control means for controlling an intensity of an optical signal that has passed through said optical means and propagates to at least one of said output ports; and
    feedback means for feeding back the optical signal that has passed through said intensity control means to said amplification means.

2. An amplifier according to claim 1, wherein said intensity control means is a semiconductor optical amplifier.

3. An amplifier according to claim 1, wherein said feedback means is one of a reflecting mirror, a grating, and a loop circuit, and
    a bandgap wavelength of a gain medium that constitutes said intensity control means is shorter than that of a gain medium that constitutes said amplification means.

4. An amplifier according to claim 1, wherein said feedback means is one of a reflecting mirror, a grating, and a loop circuit, and
    a gain medium that constitutes said intensity control means is shorter than a gain medium that constitutes said amplification means.

5. An amplifier according to claim 1, wherein said feedback means is a grating, and
    a Bragg wavelength of said grating is shorter than a gain center wavelength of a gain medium that constitutes said amplification means.

6. An amplifier according to claim 1 or 2, wherein said feedback means is one of a reflecting mirror, a grating, and a loop circuit.

7. An amplifier according to claim 2, wherein a bandgap wavelength of a gain medium that constitutes said intensity control means is shorter than that of a gain medium that constitutes said amplification means.

8. An amplifier according to claim 2, wherein a gain medium that constitutes said intensity control means is shorter than a gain medium that constitutes said amplification means.

9. An amplifier according to claim 2, wherein said feedback means is a grating, and
a Bragg wavelength of said grating is shorter than a gain center wavelength of a gain medium that constitutes said amplification means.

10. An amplifier according to claim 6, wherein a bandgap wavelength of a gain medium that constitutes said intensity control means is shorter than that of a gain medium that constitutes said amplification means.

11. An amplifier according to claim 6, wherein a gain medium that constitutes said intensity control means is shorter than a gain medium that constitutes said amplification means.

12. An amplifier according to claim 6, wherein
said feedback means is a grating, and
a Bragg wavelength of said grating is shorter than a gain center wavelength of a gain medium that constitutes said amplification means.

13. An optical amplifier which amplifies a light intensity of input signal light having an arbitrary wavelength, comprising:
optical combining/distributing means for combining the input signal light with an oscillation signal light and distributing the input signal light to a plurality of input ports;
amplification means for amplifying the light intensity of the distributed input signal light and the oscillation signal light;
first optical coupling/distributing means for combining a plurality of output light beams from said amplification means and distributing the output light beams into a plurality of output ports;
second optical coupling means for coupling at least one of the output ports to at least one of the plurality of input ports of said first optical combining/distributing means;
intensity control means for controlling an intensity of an optical signal that has passed through said second optical coupling means; and
feedback means for feeding back the optical signal that has passed through said intensity control means to said amplification means.

14. An amplifier according to claim 13, wherein said intensity control means is formed from a semiconductor optical amplifier.

15. An amplifier according to claim 13, wherein said feedback means is one of a reflecting mirror and a grating (820).

16. An amplifier according to claim 13, wherein a bandgap wavelength of a gain medium that constitutes said intensity control means is shorter than that of a gain medium that constitutes said amplification means.

17. An amplifier according to claim 13, wherein a gain medium that constitutes said intensity control means is shorter than a gain medium that constitutes said amplification means.

18. An amplifier according to claim 14, wherein said feedback means is one of a reflecting mirror and a grating.

19. An amplifier according to claim 14, wherein a bandgap wavelength of a gain medium that constitutes said intensity control means is shorter than that of a gain medium that constitutes said amplification means.

20. An amplifier according to claim 14, wherein a gain medium that constitutes said intensity control means is shorter than a gain medium that constitutes said amplification means.

21. An amplifier according to claim 15, wherein a bandgap wavelength of a gain medium that constitutes said intensity control means is shorter than that of a gain medium that constitutes said amplification means.

22. An amplifier according to claim 15, wherein a gain medium that constitutes said intensity control means is shorter than a gain medium that constitutes said amplification means.

23. An amplifier according to claim 18, wherein a bandgap wavelength of a gain medium that constitutes said intensity control means is shorter than that of a gain medium that constitutes said amplification means.

24. An amplifier according to claim 18, wherein a gain medium that constitutes said intensity control means is shorter than a gain medium that constitutes said amplification means.

* * * * *

UNITED STATES PATENT AND TRADEMARK OFFICE
CERTIFICATE OF CORRECTION

| | |
|---|---|
| PATENT NO. | : 7,088,501 B2 |
| APPLICATION NO. | : 10/265065 |
| DATED | : August 8, 2006 |
| INVENTOR(S) | : Shibata et al. |

It is certified that error appears in the above-identified patent and that said Letters Patent is hereby corrected as shown below:

On the Title Page

Below Item (65), insert:

--Foreign Application Priority Data

Oct. 5, 2001    [JP]   Japan 310427/2001
   Sept. 12, 2002  [JP]   Japan 266513/2002

Signed and Sealed this

Sixteenth Day of January, 2007

JON W. DUDAS
*Director of the United States Patent and Trademark Office*